US009204552B2

(12) United States Patent
Furutani et al.

(10) Patent No.: US 9,204,552 B2
(45) Date of Patent: Dec. 1, 2015

(54) PRINTED WIRING BOARD

(71) Applicant: IBIDEN Co., Ltd., Ogaki-shi (JP)

(72) Inventors: Toshiki Furutani, Ogaki (JP);
Yukinobu Mikado, Ogaki (JP);
Mitsuhiro Tomikawa, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 101 days.

(21) Appl. No.: 13/685,777

(22) Filed: Nov. 27, 2012

(65) Prior Publication Data
US 2013/0192884 A1    Aug. 1, 2013

Related U.S. Application Data

(60) Provisional application No. 61/590,980, filed on Jan. 26, 2012.

(51) Int. Cl.
*H05K 1/16* (2006.01)
*H05K 1/18* (2006.01)
*H05K 1/02* (2006.01)
*H05K 3/46* (2006.01)

(52) U.S. Cl.
CPC ............. *H05K 1/181* (2013.01); *H05K 1/185* (2013.01); *H05K 1/0231* (2013.01); *H05K 3/4697* (2013.01); *H05K 2201/096* (2013.01); *H05K 2201/09527* (2013.01)

(58) Field of Classification Search
CPC ..... H05K 1/185; H05K 1/181; H05K 1/0231; H05K 2201/09527; H05K 2201/096; H05K 3/4697

USPC .......................................................... 361/761
See application file for complete search history.

(56) References Cited

U.S. PATENT DOCUMENTS

| | | | |
|---|---|---|---|
| 2005/0039948 A1* | 2/2005 | Asai et al. ...................... | 174/262 |
| 2006/0154496 A1* | 7/2006 | Imamura et al. ................ | 439/66 |
| 2008/0277150 A1* | 11/2008 | Takashima et al. ............ | 174/260 |
| 2010/0084175 A1* | 4/2010 | Suzuki et al. .................. | 174/260 |
| 2011/0240356 A1* | 10/2011 | Wakita et al. .................. | 174/264 |

FOREIGN PATENT DOCUMENTS

JP    2007-288179    11/2007

* cited by examiner

*Primary Examiner* — Steven T Sawyer
(74) *Attorney, Agent, or Firm* — Oblon, McClelland, Maier & Neustadt, L.L.P.

(57) ABSTRACT

A printed wiring board includes a core substrate, an electronic component accommodated in the substrate, a first buildup structure formed on surface of the substrate and including an interlayer insulation layer, and a second buildup structure formed on the opposing surface of the substrate and including an interlayer insulation layer. The substrate includes a core material portion including multiple resin layers, a first conductive layer formed on first surface of the core portion and a second conductive layer formed on second surface of the core portion, the core portion has opening through the resin layers and accommodating the component, the insulation layer of the first structure is positioned such that the opening of the core portion is covered on the first surface, and the insulation layer of the second structure is positioned such that the opening of the core portion is covered on the second surface.

20 Claims, 16 Drawing Sheets (A)

(B)

(C)

(D)

(A)

(B)

(A)

(B)

(C)

(D)

(E)

(A)

(B)

(C)

(D)

(A)

(B)

(C)

(D)

(A)

(B)

(C)

(D)

(A)

(B)

(A)

(B)

(C)

(A)

(B)

(A)

(B)

(A)

(B)

(C)

(D)

PRINTED WIRING BOARD

CROSS-REFERENCE TO RELATED APPLICATIONS

The present application is based upon and claims the benefit of priority from U.S. Application No. 61/590,980, filed Jan. 26, 2012, the entire contents of which are incorporated herein by reference.

BACKGROUND OF THE INVENTION

1. Field of the Invention

The present invention relates to a printed wiring board with a built-in electronic component.

2. Description of Background Art

Japanese Laid-Open Patent No. 2007-288179 describes a printed wiring board with a chip capacitor built into a core substrate. Such a core substrate has a through-hole conductor that connects conductive circuits on upper and lower surfaces. The entire contents of this publication are incorporated herein by reference.

SUMMARY OF THE INVENTION

According to one aspect of the present invention, a printed wiring board includes a core substrate, an electronic component accommodated in the core substrate, a first buildup structure formed on a first surface of the core substrate and including an interlayer resin insulation layer, and a second buildup structure formed on a second surface of the core substrate and including an interlayer resin insulation layer. The core substrate includes a core material portion including multiple resin layers, a first conductive layer formed on a first surface of the core material portion and a second conductive layer formed on a second surface of the core material portion on the opposite side of the first surface of the core material portion, the core material portion has an opening portion penetrating through the resin layers and accommodating the electronic component in the space of the opening portion, the interlayer resin insulation layer of the first buildup structure is positioned such that the opening portion of the core material portion is covered on the first surface of the core material portion, and the interlayer resin insulation layer of the second buildup structure is positioned such that the opening portion of the core material portion is covered on the second surface of the core material portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
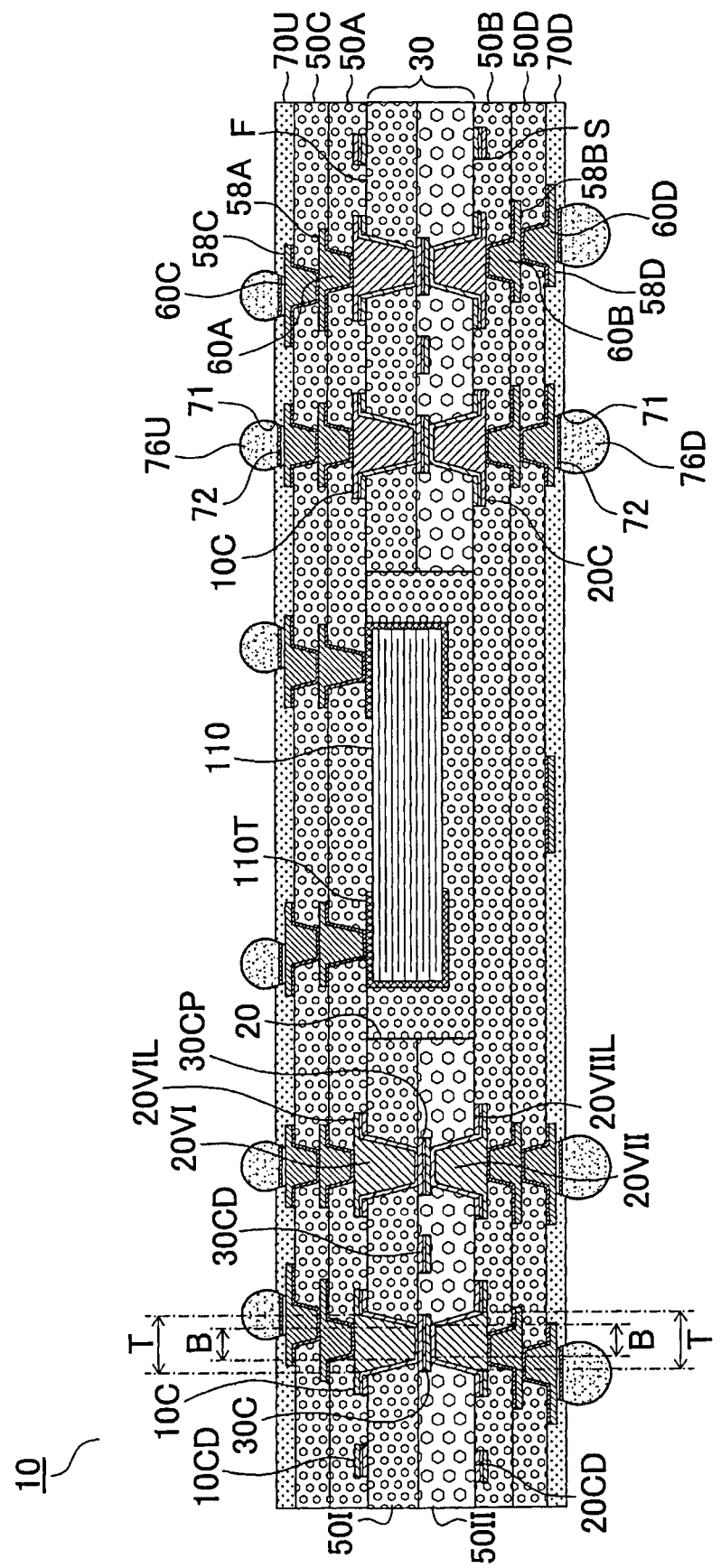
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Figure 3:
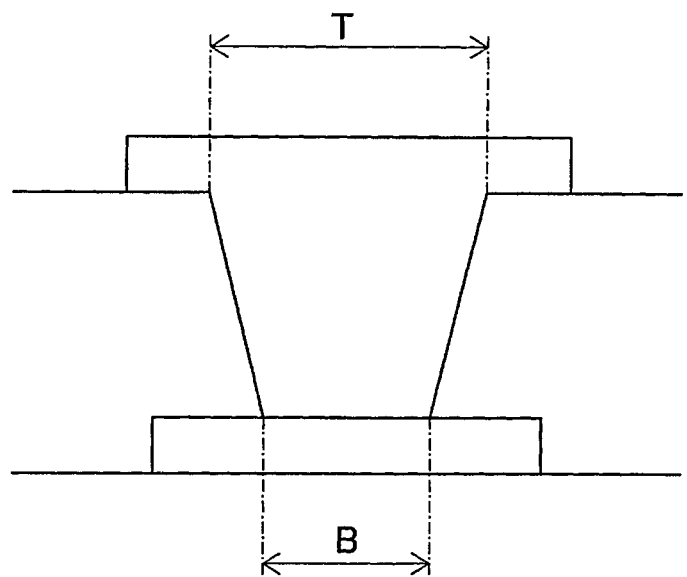
FIGS. 3(A)-3(B) are views illustrating a filled via.
Figure 3:
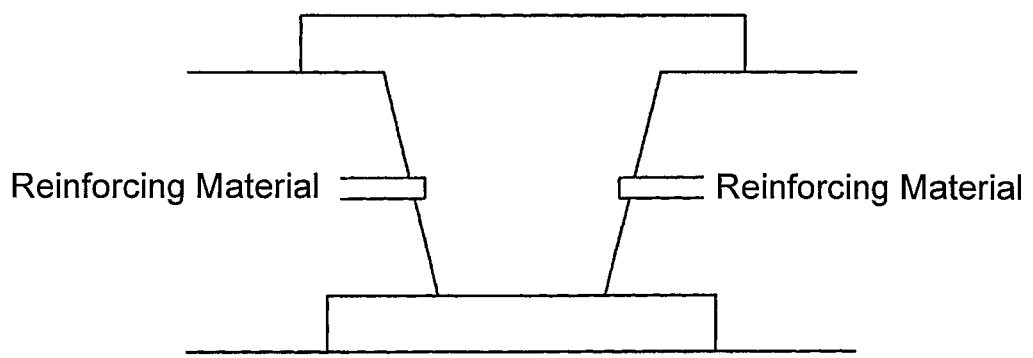

FIG. 1 shows a cross-sectional view of printed wiring board 10 according to a first embodiment of the present invention. In printed wiring board 10, electronic component 110 such as a chip capacitor is built into core substrate 30 which has first surface (F) and second surface (S) opposite the first surface. Core substrate 30 includes third conductive layer (30C) along with first resin layer (50I) and second resin layer (50II) sandwiching the third conductive layer. Each resin layer of the core substrate is preferred to contain reinforcing material such as glass cloth. The first resin layer has a first surface and a third surface, and the second resin layer has a second surface and a fourth surface. The first resin layer is laminated on the second resin layer in such a way that the third surface of the first resin layer faces the fourth surface of the second resin layer. The first surface of the first resin layer and the second surface of the second resin layer are outer-side surfaces. The first surface of core substrate 30 corresponds to the first surface of the first resin layer, and the second surface of substrate 30 corresponds to the second surface of the second resin layer. The core substrate further includes first conductive layer (10C) on the first surface of the first resin layer and second conductive layer (20C) on the second surface of the second resin layer. Moreover, the core substrate has via conductor (interlayer connection conductor) (20VI) which penetrates through the first resin layer and connects the first conductive layer and the third conductive layer as well as via conductor (interlayer connection conductor) (20VII) which penetrates through the second resin layer and connects the second conductive layer and the third conductive layer. Each conductive layer includes multiple conductive circuits (10CD, 20CD, 30CD). In addition, the first conductive layer and the second conductive layer have via lands (20VIL, 20VIIL). The first conductive layer and the second conductive layer are connected through a via conductor in the first resin layer, the third conductive layer, and a via conductor in the second resin layer. A via conductor in the first resin layer, via pad (30CP) of the third conductive layer, and a via conductor in the second resin layer are laminated along a straight line. They function as a through-hole conductor. Via pad (30CP) is sandwiched by a via conductor in the first resin layer and a via conductor in the second resin layer. A via conductor in the first resin layer has a bottom surface connected to the third conductive layer. Diameter (B) of the bottom surface (bottom diameter) is shown in FIGS. 1 and 3(A). Also, the via conductor in the first resin layer has top diameter (T) on the interface between the first surface of the core substrate and the first conductive layer (FIGS. 1 and 3(A)). Top diameter (T) is greater than bottom diameter (B). A via conductor in the second resin layer has a bottom surface connected to the third conductive layer. Diameter (B) of the bottom surface (bottom diameter) is shown in FIG. 1. Also, the via conductor in the second resin layer has top diameter (T) on the interface between the second surface of the core substrate and the second conductive layer (FIG. 1). Top diameter (T) is greater than the bottom diameter. Via conductors are formed by filling via-conductor openings formed in resin layers with metal such as plating. Via conductors in the first embodiment are filled vias. The diameter of a via conductor is preferred to decrease from the top diameter toward the bottom diameter (FIG. 3(A)). When a resin layer contains reinforcing material, the reinforcing material enters a via conductor (FIG. 3(B)). The via conductor shown in FIG. 3(B) is included in the embodiment. Top and bottom diameters are also shown in FIGS. 4(B) and 5(C).

The core substrate further includes opening 20 which reaches second surface (S) from first surface (F). Opening 20 penetrates through multiple resin layers of the core substrate. An electronic component is accommodated in the opening.

In the first embodiment, the core substrate having opening 20 to accommodate an electronic component is formed with multiple resin layers. The core substrate of the present embodiment is formed with multiple resin layers, and a via-conductor opening is formed in each resin layer. Therefore, the depth of each via-conductor opening is shallower in the first embodiment, compared with a case in which a penetrating hole for a through-hole conductor is formed in a single-layered core substrate. Accordingly, the diameter of a via-conductor opening is set smaller. The pitch of through-hole conductors is set narrower in the first embodiment.

The thickness of each resin layer is set less when the core substrate is formed with multiple resin layers. Thus, it is easier to fill plating in a via-conductor opening formed in each resin layer. Via conductors with fewer defects such as voids or without defects are formed. Accordingly, the resistance of the through-hole conductor is reduced.

The core substrate of the first embodiment has an opening to accommodate an electronic component. Thus, the strength of the core substrate is low. However, since a through-hole conductor of the first embodiment is formed with filled vias and via pads made of metal, the strength of the core substrate is high. Accordingly, even with an opening in the core substrate for accommodating an electronic component, warping of the printed wiring board is slight. The electronic component built into the core substrate is unlikely to suffer damage. Although each resin layer is thin, since the strength of the core substrate is high because of through-hole conductors, a thin electronic component can be built into the core substrate. For example, an electronic component with a thickness in a range of 60 µm to 150 µm can be built into the printed wiring board of the present embodiment. When the size of a printed wiring board is 20 mm×20 mm or smaller, an electronic component with a thickness of 120 µm or less can be accommodated in a printed wiring board of the present embodiment.

Figure 2:
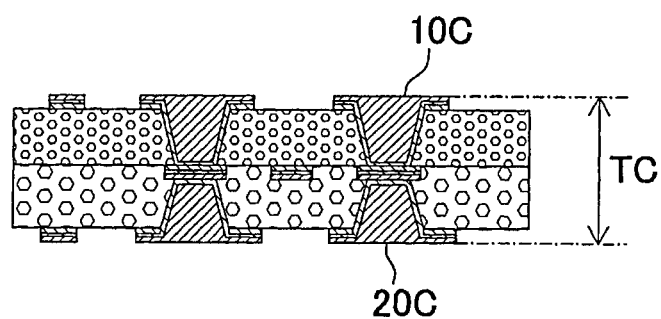
FIGS. 2(A)-2(D) are views illustrating part of the core substrate of the printed wiring board according to the first embodiment and an electronic component.
Figure 2:
Figure 2:
Figure 2:
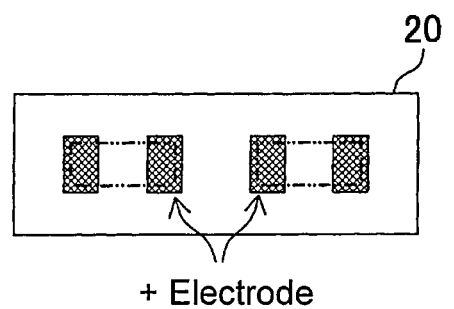

The thickness of the core substrate is the same as or greater than the thickness of an electronic component. The difference between the thickness of the core substrate and the thickness of an electronic component is 0 to 20 µm. FIG. 2 shows the thickness of the core substrate and the thickness of an electronic component. Thickness (TC) of the core substrate is the distance from the upper surface of the first conductive layer to the upper surface of the second conductive layer (FIG. 2(A)). FIG. 2(B) shows thickness (TE1) of an electronic component which has electrodes on both of its surfaces. Chip capacitors or inductors are listed for such an electronic component. FIG. 2(C) shows thickness (TE2) of an electronic component which has an electrode on one of its surfaces. IC chips and memories are listed for such an electronic component. Multiple chip capacitors may be built into an opening for accommodating an electronic component in the printed wiring board of the present embodiment. In such a case, adjacent chip capacitors are built into the opening in such a way that a plus electrode faces a plus electrode or a minus electrode faces a minus electrode (FIG. 2(D)). In FIG. 2(D), plus electrodes face each other.

Upper buildup layers are formed on first surface (F) of core substrate 30 and the chip capacitor. The upper buildup layers include insulation layer (first interlayer resin insulation layer) (50A) which is formed on first surface (F) of core substrate 30 and chip capacitor 110, conductive layer (upper conductive layer) (58A) on insulation layer (50A), and via conductors (60A) which penetrate through insulation layer (50A) and connect first conductive layer (10C) and through-hole conductors with conductive layer (58A). Via conductors (60A) include a via conductor that connects conductive layer (58A) and electrode (110T) of an electronic component such as a chip capacitor. Moreover, the upper buildup layer has insulation layer (uppermost interlayer resin insulation layer) (50C) on insulation layer (50A) and conductive layer (58A), conductive layer (uppermost conductive layer) (58C) on insulation layer (50C), and via conductors (60C) which penetrate through insulation layer (50C) and connect conductive layer (58A) and via conductors (60A) with conductive layer (58C).

Lower buildup layers are formed under second surface (S) of core substrate 30 and the chip capacitor. The lower buildup layers include insulation layer (second interlayer resin insulation layer) (50B) formed under second surface (S) of core substrate 30 and the chip capacitor, conductive layer (lower conductive layer) (58B) under insulation layer (50B), and via conductors (60B) which penetrate through insulation layer (50B) and connect second conductive layer (20C) and through-hole conductors with conductive layer (58B). Moreover, the second buildup layers include insulation layer (lowermost interlayer resin insulation layer) (50D) under insulation layer (50B) and conductive layer (58B), conductive layer (lowermost conductive layer) (58D) under insulation layer (50D), and via conductors (60D) which penetrate through insulation layer (50D) and connect conductive layer (58B) and conductive layer (58D). The interlayer resin insulation layers of the buildup layers may contain reinforcing material such as glass cloth. The gap in the opening for accommodating an electronic component is filled with filler. The gap is the space between the electronic component and the core substrate. The gap is filled with the resin ingredient from interlayer resin insulation layers.

Solder-resist layers (70U, 70D) having openings 71 are formed on upper and lower buildup layers. Conductive layers (58C, 58D) and upper surfaces of via conductors (60C, 60D) exposed through the openings of solder-resist layers work as pads. Metal film 72 made of Ni/Pd/Au is formed on the pads, and solder bumps (76U, 76D) are formed on the metal film. An IC chip is mounted on printed wiring board 10 through solder bumps (76U) formed on the upper buildup layers. The printed wiring board is connected to a motherboard through solder bumps (76D) formed on the lower buildup layers.

In the first embodiment, since chip capacitor 110 is built into core substrate 30, the distance between chip capacitor 110 and IC chip 90 is short. Thus, since power to the IC chip is instantaneously supplied, the malfunctions are unlikely to occur in the IC chip.

The thickness of the core substrate is greater than the thickness of the electronic component. Thus, even when interlayer resin insulation layers contain reinforcing material, the electronic component seldom suffers damage while buildup layers are formed.

In the first embodiment, part of via conductor (60C) in insulation layer (50C) is formed directly on via conductor (60A) in insulation layer (50A), allowing wiring distance to be reduced.

FIGS. 4-9 show a method for manufacturing printed wiring board 10 of the first embodiment.

(1) The starting material is double-sided copper-clad laminate (30AZ) made of insulative base (30A) having first surface (F) and a third surface opposite the first surface and of copper foils 32 laminated on both of its surfaces. The thickness of the insulative base is 30~150 μm. If the thickness is less than 30 μm, the strength of the substrate is too low. If the thickness exceeds 150 μm, the thickness of the printed wiring board increases. A black-oxide treatment not shown in the drawing is performed on surfaces of copper foils 32 (FIG. 4(A)). The insulative base contains glass cloth. The glass is made of T glass (made by Nitto Boseki, Co., Ltd.) Insulative base (30A) corresponds to first resin layer (50I).

(2) A laser is irradiated from the first-surface (F) side of the insulative base on double-sided copper-clad laminate (30AZ). Via-conductor openings (70a) are formed in the insulative base (FIG. 4(B)).

(3) Electroless plated film 33 is formed on the inner walls of openings (70a) and the copper foils by performing electroless plating (FIG. 4(C)).

(4) Electrolytic plated film 37 is formed on the electroless plated film by performing electrolytic plating. Openings (70a) are filled with electrolytic plated film, and via conductors (20VI) are formed. Via conductors (20VI) are made of electroless plated film 33 formed on the inner walls of openings (70a) and of electrolytic plated film 37 filled in openings (70a) (FIG. 4(D)).

(5) Etching resist 35 with a predetermined pattern is formed on electrolytic plated film 37 (FIG. 4(E)).

(6) Electrolytic plated film 37, electroless plated film 33 and copper foil 32 exposed from the etching resist are removed. Then, the etching resist is removed. First conductive layer (10C), third conductive layer (30C) and via conductors (20VI) are formed (FIG. 5(A)).

(7) Prepreg and metal foil 32 are laminated on the third surface of first resin layer (50I) and the third conductive layer. Then, thermal pressing is conducted to laminate prepreg and metal foil 32 on the third surface of first resin layer (50I) and the third conductive layer. Second conductive layer (50II) is formed from the prepreg (FIG. 5(B)). The second resin layer has a second surface and a fourth surface opposite the second surface. The fourth surface faces the third surface of the first resin layer, and the second surface faces the metal foil. The first surface of the first resin layer is the outermost layer of the core substrate.

(8) A CO2 gas laser is irradiated from the second-surface side of the second resin layer so that via-conductor openings (70b) reaching the third conductive layer are formed in the second resin layer (FIG. 5(C)).

(9) The first surface of the first resin layer and the first conductive layer are covered with protective film 500. Then, electroless plated film 330 is formed on the inner walls of via-conductor openings (70b) and on metal foil 32 by performing electroless plating (FIG. 5(D)).

(10) Plating resist 350 is formed on electroless plated film 330 (FIG. 6(A)).

(11) Next, by performing electrolytic plating, electrolytic plated film 370 is formed on electroless plated film 330 exposed from plating resist 350 (see FIG. 6(B)).

(12) Next, plating resist 350 is removed. Then, electroless plated film 330 and metal foil exposed from the electrolytic copper-plated film are etched away to form second conductive layer (20C) made of metal foil 32, electroless plated film 330 and electrolytic plated film 370. Via conductors (20VII) are formed at the same time. Protective film 500 is removed (FIG. 6(C)).

First conductive layer (10C) and second conductive layer (20C) include multiple conductive circuits and lands of via conductors. The third conductive layer includes pads (30CP) of via conductors. The third conductive layer may also include conductive circuits in addition to such pads. Pad (30CP) in the first conductive layer and via conductors (20VI, 20VII) sandwiching the pad are arrayed along a straight line, and work as a through-hole conductor.

Figure 10:
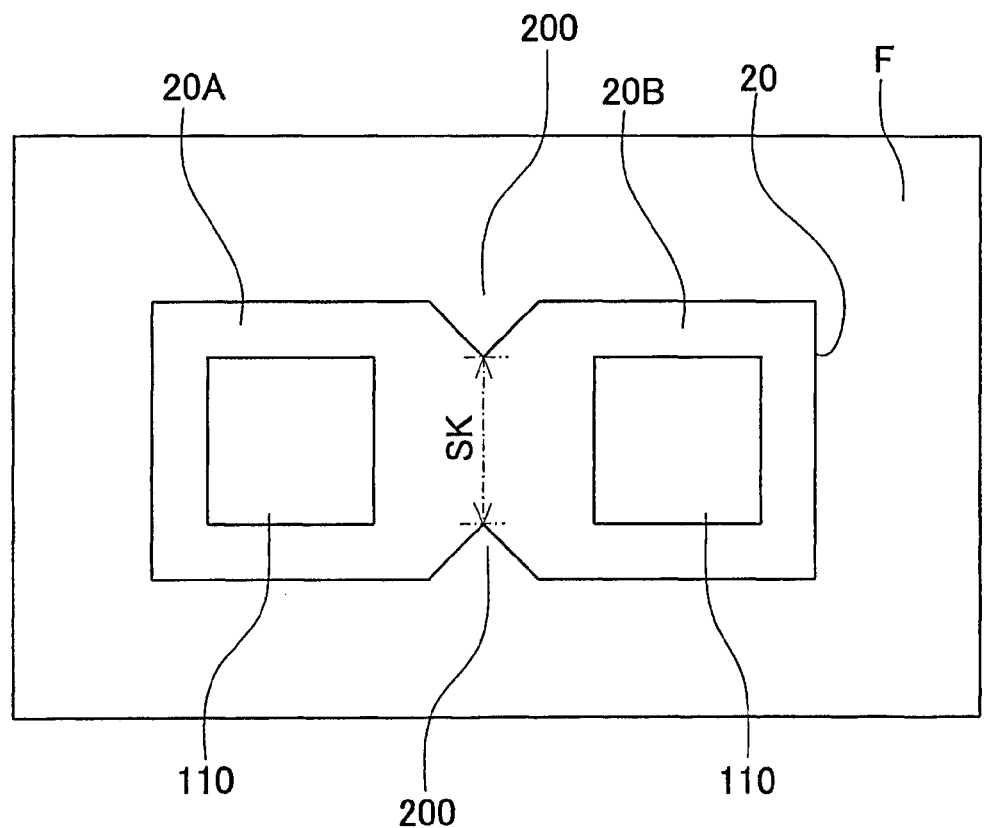
FIGS. 10(A)-10(B) are views illustrating an opening in the core substrate.
Figure 10:
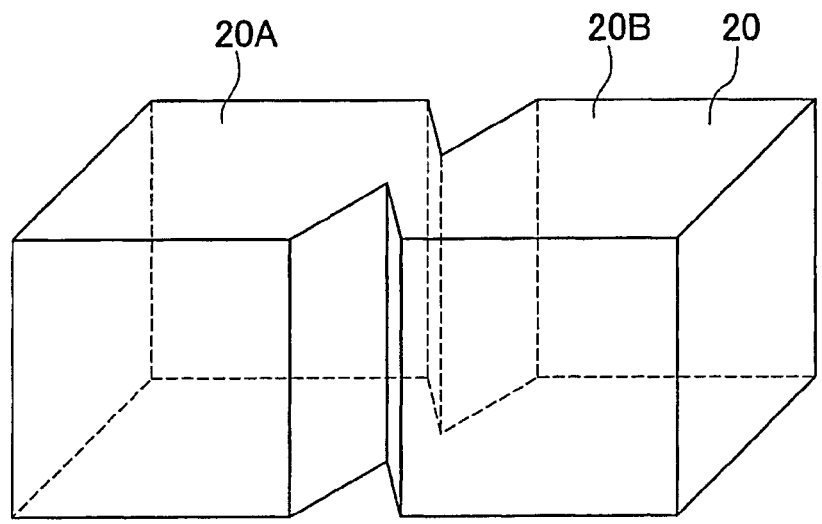

(13) Opening 20 which reaches the second surface of second resin layer (50II) from the first surface of first resin layer (50I) is formed. Opening 20 simultaneously penetrates through the first resin layer and the second resin layer. Opening 20 is formed by a laser (FIG. 6(D)). Core substrate 30 with multiple resin layers is completed. Opening 20 may taper from the second surface toward the first surface. When multiple electronic components 110 are accommodated in one opening, the core substrate is preferred to have protrusions 200 that protrude into the opening as shown in FIG. 10. FIG. 10(A) shows the first surface of the first resin layer and electronic components 20 in opening 20. FIG. 10(B) is a perspective view of opening 20. Since protrusions 200 enter the opening, adjacent electronic components do not touch each other in the opening. Opening 20 is partitioned by protrusions 200. The core substrate has partitions (protrusions) 200 so that the opening is divided into two accommodation portions (20A, 20B) by the partitions (FIG. 10). As shown in FIG. 10, the opening is divided into multiple accommodation portions by the partitions. An electronic component is accommodated in each accommodation portion. Distance (SK) between the partitions (FIG. 10(A)) is shorter than the length of the electronic components.

(14) Tape 94 is attached to the first surface of the core substrate. Opening 20 is covered by the tape (FIG. 7(A)). PET film is listed as an example of tape 94.

(15) Chip capacitor 110 is placed on tape 94 exposed through opening 20 (FIG. 7(B)). The thickness of the chip capacitor accommodated in opening 20 of the core substrate is set at 75% to 100% of the thickness of the core substrate.

(16) B-stage prepreg and metal foil 32 are laminated on the second surface of the core substrate and on the electronic component. Resin seeps out from the prepreg into the opening through thermal pressing so that filler (resin filler) 50 is filled in opening 20 (FIG. 7(C)). The gap between the inner walls of the opening and the chip capacitor is filled with the filler. The chip capacitor is secured in the core substrate. Resin film for interlayer insulation layers may be laminated instead of using prepreg. The prepreg contains reinforcing material such as glass cloth, but the resin film for interlayer resin insulation layers does not contain reinforcing material. Both of them are preferred to contain inorganic particles such as glass particles. The filler contains inorganic particles of silica or the like.

(17) After removing the tape, B-stage prepreg and metal foil 32 are laminated on the first surface of the core substrate and the electronic component. The prepreg laminated on both surfaces of the core substrate is heated and cured, and interlayer resin insulation layers (50A, 50B) are formed (FIG. 7(D)). Interlayer resin insulation layer (50A) belongs to the upper buildup layers, and interlayer resin insulation layer (50B) belongs to the lower buildup layers.

(18) Via-conductor openings (500A) reaching the first conductive layer and the via conductors in the first resin layer are formed in interlayer resin insulation layer (50A). Simultaneously, via conductors reaching the electrodes of the electronic component are formed.

Via-conductor openings (500B) reaching the second conductive layer and the via conductors in the second resin layer are formed in interlayer resin insulation layer (50B). Electroless plated films 520 are formed on metal foils (32, 32) and on the inner walls of openings (500A, 500B) (FIG. 8(A)). Then, plating resists (540, 540) are formed on the electroless plated films (FIG. 8(B)). Next, electrolytic plated films (580, 580) are formed on the electroless plated films exposed from plating resists (540, 540) (FIG. 8(C)). Then, the plating resists are removed, and electroless plated films (520, 520) and metal foils (32, 32) exposed from the electrolytic plated film are removed. The first layers of the buildup layers are completed (FIG. 8(D)). The first layers of the buildup layers are formed with interlayer resin insulation layers (50A, 50B), conductive layers (58A, 58B) on the interlayer resin insulation layers, and via conductors (60A, 60B) penetrating through the interlayer resin insulation layers. Via conductors (60A) connect the first conductive layer, through-hole conductors, and the electrodes of the electronic component with conductive layer (58A). Via conductors (60B) connect the second conductive layer and through-hole conductors with conductive layer (58B).

Prepreg and metal foils (32, 32) are laminated on interlayer resin insulation layers (50A, 50B) and conductive layers (58A, 58B), and are thermally pressed to form interlayer resin insulation layers (50C, 50D) (FIG. 9(A)). Then, steps in FIGS. 7(E)-8(D) are repeated so that the second layers of the buildup layers are formed (FIG. 9(B)). The buildup layers on the first surface of the core substrate are the upper buildup layers, and the buildup layers on the second surface of the core substrate are the lower buildup layers. Interlayer resin insulation layers (50A, 50B, 50C, 50D) each contain reinforcing material such as glass cloth.

(19) Solder-resist layers (70U, 70D) having openings 71 are formed on the upper and lower buildup layers (FIG. 9(C)). Openings 71 expose portions of the conductive layers and upper surfaces of the via conductors, and such portions work as pads.

(20) Metal film 72 made of a nickel layer and a gold layer on the nickel layer are formed on the pads (FIG. 9(D)). In addition to nickel-gold layers, metal film made of nickel-palladium-gold layers may be listed. In a printed wiring board shown in FIG. 1, connection via conductors are formed only in the upper buildup layers. Connection via conductors are the via conductors connected to the electrodes of the electronic component. Thus, the lower buildup layers are not required to have conductive circuits under the electronic component such as a chip capacitor. When the lower buildup layers directly under the chip capacitor do not include conductive circuits, warping tends to occur in the printed wiring board. In such a case, the thickness of the insulation layers in the upper buildup layers is preferred to be greater than the thickness of the lower buildup layers.

(21) After that, solder bumps (76U) are formed on the pads of the upper buildup layers, and solder bumps (76D) are formed on the pads of the lower buildup layers. Printed wiring board 10 with solder bumps is completed (FIG. 1).

An IC chip is mounted on printed wiring board 10 through solder bumps (76U) (not shown in the drawings). Then, the printed wiring board is connected to a motherboard through solder bumps (76D) (not shown in the drawings).

Second Embodiment

Figure 11:
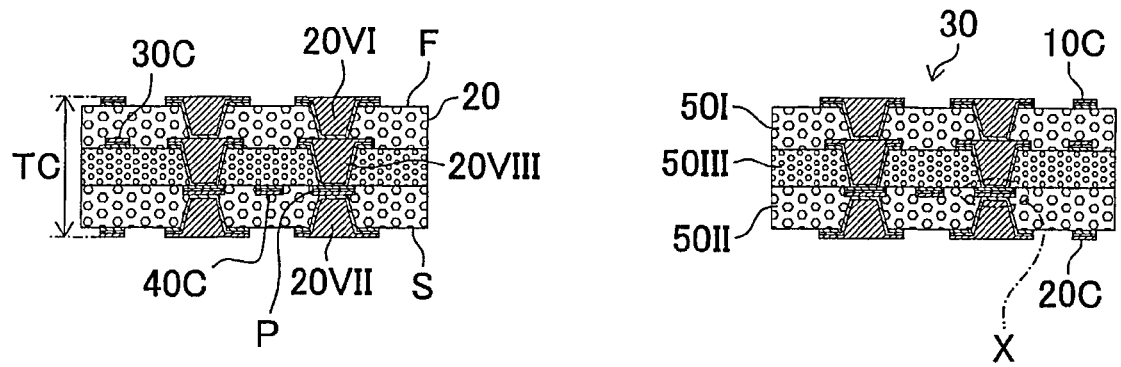
FIGS. 11(A)-11(C) are views showing the core substrate of a printed wiring board according to a second embodiment.
Figure 11:
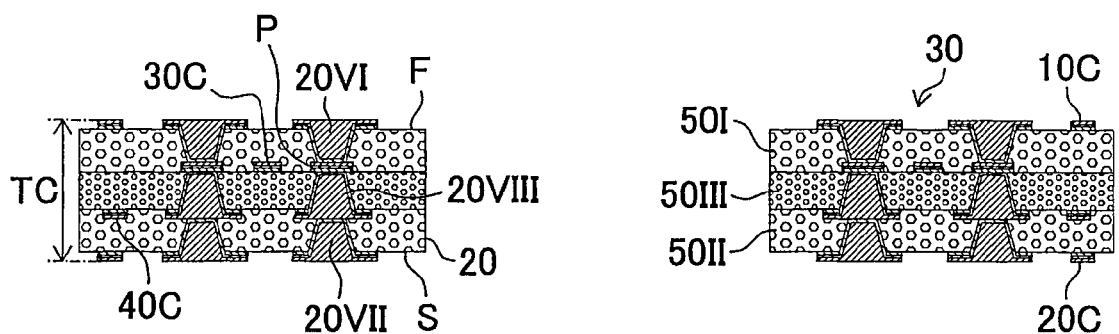
Figure 11:
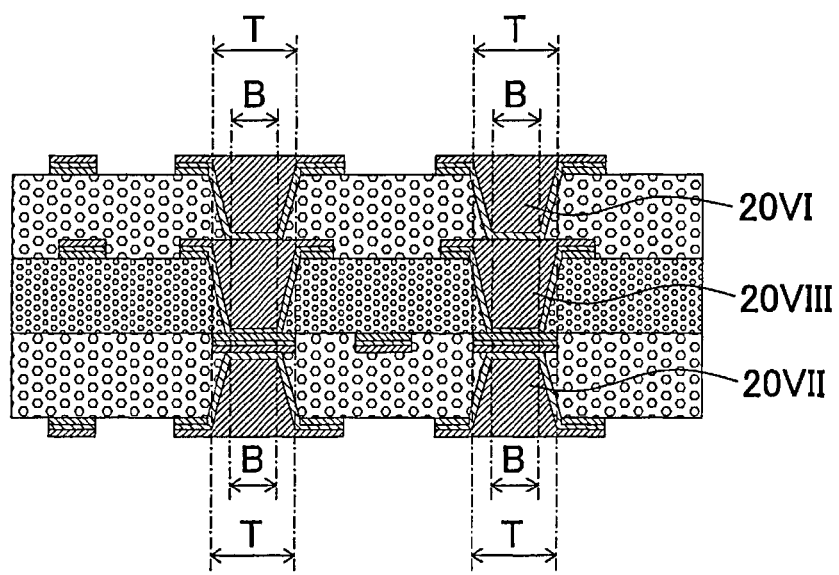

FIG. 11(A) is a cross-sectional view of a core substrate of a printed wiring board according to a second embodiment. Core substrate 30 of the printed wiring board in the second embodiment includes third resin layer (50III) along with first resin layer (50I) and second resin layer (50II) sandwiching the third resin layer. The first resin layer has a first surface and a third surface opposite the first surface, the second resin layer has a second surface and a fourth surface opposite the second surface, and the third resin layer has a fifth surface and a sixth surface opposite the fifth surface. The first resin layer is the uppermost layer of the core substrate and the second resin layer is the lowermost layer of the core substrate. First surface (F) of the core substrate corresponds to the first surface of the first resin layer, and second surface (S) of the core substrate corresponds to the second surface of the second resin layer. The third surface of the first resin layer faces the fifth surface of the third resin layer, and the fourth surface of the second resin layer faces the sixth surface of the third resin layer. Resin layers (50I, 50II, 50III) each contain reinforcing material. If the thickness of the third resin layer is greater than the thickness of the first resin layer or the thickness of the second resin layer, it is easier to adjust the thickness of the core substrate. The thickness of the core substrate is set the same as that of the built-in electronic component. If the thickness of each resin layer is substantially the same, the length of via conductors in each resin layer is set equal. The reliability of through-hole conductors is enhanced.

The core substrate has first conductive layer (10C) on the first surface of the first resin layer, second conductive layer (20C) on the second surface of the second resin layer, third conductive layer (30C) between the first resin layer and the third resin layer, and fourth conductive layer (40C) between the second resin layer and the third resin layer. The first, second and third conductive layers include via lands, and the fourth conductive layer includes via pads (P) (pads for via conductors). The first, second, third and fourth conductive layers may further include conductive circuits.

The core substrate further includes interlayer connection conductor (via conductor) (20VI) which penetrates through the first resin layer and connects the first conductive layer and the third conductive layer, interlayer connection conductor (via conductor) (20VII) which penetrates through the second resin layer and connects the second conductive layer and the fourth conductive layer, and interlayer connection conductor (via conductor) (20VIII) which penetrates through the third resin layer and connects the third conductive layer and the fourth conductive layer.

Via conductors (20VI, 20VII, 20VIII) are laminated along a straight line, and a through-hole conductor is formed with those via conductors and via pad (P) sandwiched by via conductor (20VII) and via conductor (20VIII). Via conductor (20VI) is laminated directly on via conductor (20VIII), and via conductor (20VIII) and via conductor (20VII) sandwich via pad (P).

FIG. 11(C) shows through-hole conductors of the second embodiment. Via conductor (20VI) has top diameter (T) on the interface between the first surface of the first resin layer and the first conductive layer. Then, via conductor (20VI) has a bottom surface connected to via conductor (20VIII), and bottom diameter (B) is on the bottom surface.

Via conductor (20VII) has top diameter (T) on the interface between the second surface of the second resin layer and the second conductive layer. Then, via conductor (20VII) has a bottom surface connected to a via pad, and bottom diameter (B) is on the bottom surface.

Via conductor (20VIII) has top diameter (T) on the interface between the fifth surface of the third resin layer and the third conductive layer. Then, via conductor (20VIII) has a bottom surface connected to the via pad, and bottom diameter (B) is on the bottom surface.

Top diameters of via conductors (20VI, 20VII, 20VIII) are greater than the bottom diameters. Via conductors (20VI, 20VII, 20VIII) each become narrower toward their respective bottom surfaces, the same as in the first embodiment.

The core substrate of the second embodiment also has opening 20, the same as in the first embodiment. Opening 20 reaches the second surface of the second resin layer from the first surface of the first resin layer, and simultaneously penetrates through the first resin layer, the second resin layer and the third resin layer. The core substrate of the second embodiment may also have such protrusions (partitions) as in the first embodiment.

An electronic component is accommodated in the opening of the core substrate of the second embodiment, upper buildup layers are formed on the first surface of the core substrate and the electronic component, and lower buildup layers are formed on the second surface of the core substrate and the electronic component. Then, solder-resist layers (70U, 70D) are formed on the buildup layers to complete the printed wiring board of the second embodiment (FIG. 12(A)).

The printed wiring board of the second embodiment has the same effects as in the printed wiring board of the first embodiment. Moreover, since the core substrate is formed with three resin layers in the second embodiment, the thickness of each resin layer is less than that of the resin layers in the first embodiment. Accordingly, the pitch of the through-hole conductors in the second embodiment is narrower than the pitch of the through-hole conductors in the first embodiment. Also, since the depth of via-conductor openings in the second embodiment is shallower than the depth of via-conductor openings in the first embodiment, voids are prevented from occurring in via conductors in the second embodiment. In the second embodiment, there are two via conductors whose top diameters are on the first-surface side of the core substrate, while there is a via conductor whose top diameter is on the second-surface side of the core substrate. Upper buildup layers are formed on the first surface of the core substrate, and IC chip 90 is mounted on the upper buildup layers (FIG. 12(B)).

The core substrate of the first embodiment has the third conductive layer in substantially the center in a cross-sectional direction, and the upper and lower via conductors sandwich the third conductive layer. Therefore, since the core substrate is well balanced, warping of the core substrate seldom occurs. By contrast, since the through-hole conductor of the second embodiment is formed with three via conductors (20VI, 20VII, 20VIII), via conductors are not laminated in the same way as those in the core substrate of the first embodiment. If all the via conductors are laminated in the same direction, warping of the core substrate is thought to increase. Thus, in the core substrate of the second embodiment, two via conductors (20VI, 20VIII) and one via conductor (20VII) are laminated in opposite directions. Namely, the top diameters of via conductors (20VI, 20VIII) face the first surface of the core substrate, and the top diameter of via conductor (20VII) faces the second surface of the core substrate. Even though the way via conductors are laminated is unbalanced in the core substrate of the second embodiment, warping of the core substrate decreases. When defects of via conductors in the core substrate are compared between the first embodiment and the second embodiment, the second embodiment is thought to have fewer defects than the first embodiment. Accordingly, the strength of the core substrate is enhanced in the second embodiment, suppressing warping of the core substrate.

Applied Example(s) of the Second Embodiment

An IC chip can be surface-mounted on the upper buildup layers of a printed wiring board according to the second embodiment (FIG. 12(B)). In the second embodiment, power is supplied to the IC chip by way of through-hole conductors. Since the portion where bottom surfaces face each other (portion (X) surrounded by a circle in FIG. 11(A)) is narrow in a through-hole conductor, resistance is thought to be the highest in that portion. In the second embodiment, portion (X) is closer to a motherboard than to the center of the core substrate in a cross-sectional direction of the core substrate. Therefore, portion (X) is thought to have little impact on power supply, because it is thought that current loss and voltage drop are slight before power reaches portion (X).

Modified Example(s) of the Second Embodiment

FIG. 11(B) is a cross-sectional view of the core substrate of a printed wiring board according to a modified example of the second embodiment.

Core substrate 30 of a modified example of the printed wiring board according to the second embodiment has third resin layer (50III) along with first resin layer (50I) and second resin layer (50II) sandwiching the third resin layer. The first resin layer and the second resin layer are outermost resin layers of the core substrate. The first resin layer has a first surface and a third surface opposite the first surface, the second resin layer has a second surface and a fourth surface opposite the second surface, and the third resin layer has a fifth surface and a sixth surface opposite the fifth surface. The first resin layer is the uppermost layer of the core substrate, and the second resin layer is the lowermost layer of the core substrate. First surface (F) of the core substrate corresponds to the first surface of the first resin layer, and second surface (S) of the core substrate corresponds to the second surface of the second resin layer. The third surface of the first resin layer faces the fifth surface of the third resin layer, and the fourth surface of the second resin layer faces the sixth surface of the third resin layer. Resin layers (50I, 50II, 50III) each contain reinforcing material. If the thickness of the third resin layer is greater than the thickness of the first resin layer or the thickness of the second resin layer, it is easier to adjust the thickness of the core substrate. The thickness of the built-in electronic component becomes the same as the thickness of the core substrate. If the thickness of each resin layer is substantially the same, the length of a via conductor in each resin layer becomes the same. The reliability of through-hole conductors is enhanced.

The core substrate has first conductive layer (10C) on the first surface of the first resin layer, second conductive layer (20C) on the second surface of the second resin layer, third conductive layer (30C) between the first resin layer and the third resin layer, and fourth conductive layer (40C) between the second resin layer and the third resin layer. First, second and fourth conductive layers contain via lands, and the third conductive layer contains via pads (P). First, second, third and fourth conductive layers may further contain conductive circuits.

Furthermore, the core substrate has interlayer connection conductor (via conductor) (20VI) which penetrates through the first resin layer and connects the first conductive layer and the third conductive layer, interlayer connection conductor (via conductor) (20VII) which penetrates through the second resin layer and connects the second conductive layer and the fourth conductive layer, and interlayer connection conductor (via conductor) (20VIII) which penetrates through the third resin layer and connects the third conductive layer and the fourth conductive layer. Via conductors (20VI, 20VII, 20VIII) and via pad (P) are laminated along a straight line. They work as a through-hole conductor.

Via conductor (20VI) has top diameter (T) on the interface between the first surface of the first resin layer and the first conductive layer. Via conductor (20VI) has a bottom surface connected to via pad (P), and bottom diameter (B) is on the bottom surface.

Via conductor (20VII) has top diameter (T) on the interface between the second surface of the second resin layer and the second conductive layer. Via conductor (20VII) has a bottom surface connected to via conductor (20VIII), and bottom diameter (B) is on the bottom surface.

Via conductor (20VIII) has top diameter (T) on the interface between the sixth surface of the third resin layer and the fourth conductive layer. Via conductor (20VIII) has a bottom surface connected to the via pad, and bottom diameter (B) is on the bottom surface.

Top diameters of via conductors (20VI, 20VII, 20VIII) are greater than the bottom diameters. Via conductors (20VI, 20VII, 20VIII) each become narrower toward their respective bottom surfaces, the same as in the first embodiment.

The core substrate of a modified example of the second embodiment also has opening 20 the same as in the first embodiment. Opening 20 reaches the second surface of the second resin layer from the first surface of the first resin layer, and simultaneously penetrates through the first resin layer, the second resin layer and the third resin layer. The core substrate of a modified example of the second embodiment may also have protrusions such as those in the first embodiment.

An electronic component is accommodated in the opening of the core substrate according to a modified example of the second embodiment. Upper buildup layers are formed on the first surface of the core substrate and the electronic component, and lower buildup layers are formed on the second surface of the core substrate and the electronic component. Solder-resist layers (70U, 70D) are formed on the buildup layers to complete a printed wiring board according to a modified example of the second embodiment (FIG. 13(A)).

The printed wiring board according to a modified example of the second embodiment has the same effects as in the printed wiring board according to the first embodiment. Moreover, since the core substrate is formed with three resin layers in a modified example of the second embodiment, the thickness of each resin layer is less than the thickness of resin layers in the first embodiment. Accordingly, the pitch of the through-hole conductors in a modified example of the second embodiment is narrower than the pitch of the through-hole conductors in the first embodiment. Also, since the depth of via-conductor openings in a modified example of the second embodiment is shallower than the depth of via-conductor openings in the first embodiment, voids are prevented from occurring in via conductors in a modified example of the second embodiment.

In a modified example of the second embodiment, there is one via conductor whose top diameter is on the first-surface side of the core substrate, while there are two via conductors whose top diameters are on the second-surface side of the core substrate. Upper buildup layers are formed on the first surface of the core substrate, and an IC chip is mounted on the upper buildup layers. The printed wiring board according to a modified example of the second embodiment has the same effects as in the printed wiring board according to the second embodiment.

Applied Example(s) of a Modified Example of the Second Embodiment

FIGS. 13(A) and (B) show applied examples of a modified example of the second embodiment. Upper buildup layers in FIGS. 13(A) and (B) each have connection via conductors, but lower buildup layers do not have connection via conductors. Electronic component 110 in FIG. 13(A) is a chip capacitor, and electronic component 110 in FIG. 13(B) is an IC chip. Only the upper buildup layers have connection via conductors. Therefore, positions of connection via conductors are unbalanced on the upper and lower surfaces of an electronic component. Also, as described in the second embodiment, three via conductors form a through-hole conductor in those applied examples. Accordingly, positions of via conductors in the core substrate are also unbalanced in a cross-sectional direction, causing concern in connection reliability between connection via conductors and the electronic component. Thus, in the applied examples of a modified example of the second embodiment, only the upper buildup layers have connection via conductors, and two via conductors (20VI, 20VIII) whose bottom surfaces face each other are positioned on the side of the upper buildup layers. In those applied examples, positions of via conductors in a printed wiring board are balanced by connection via conductors and via conductors of through-hole conductors.

Figure 14:
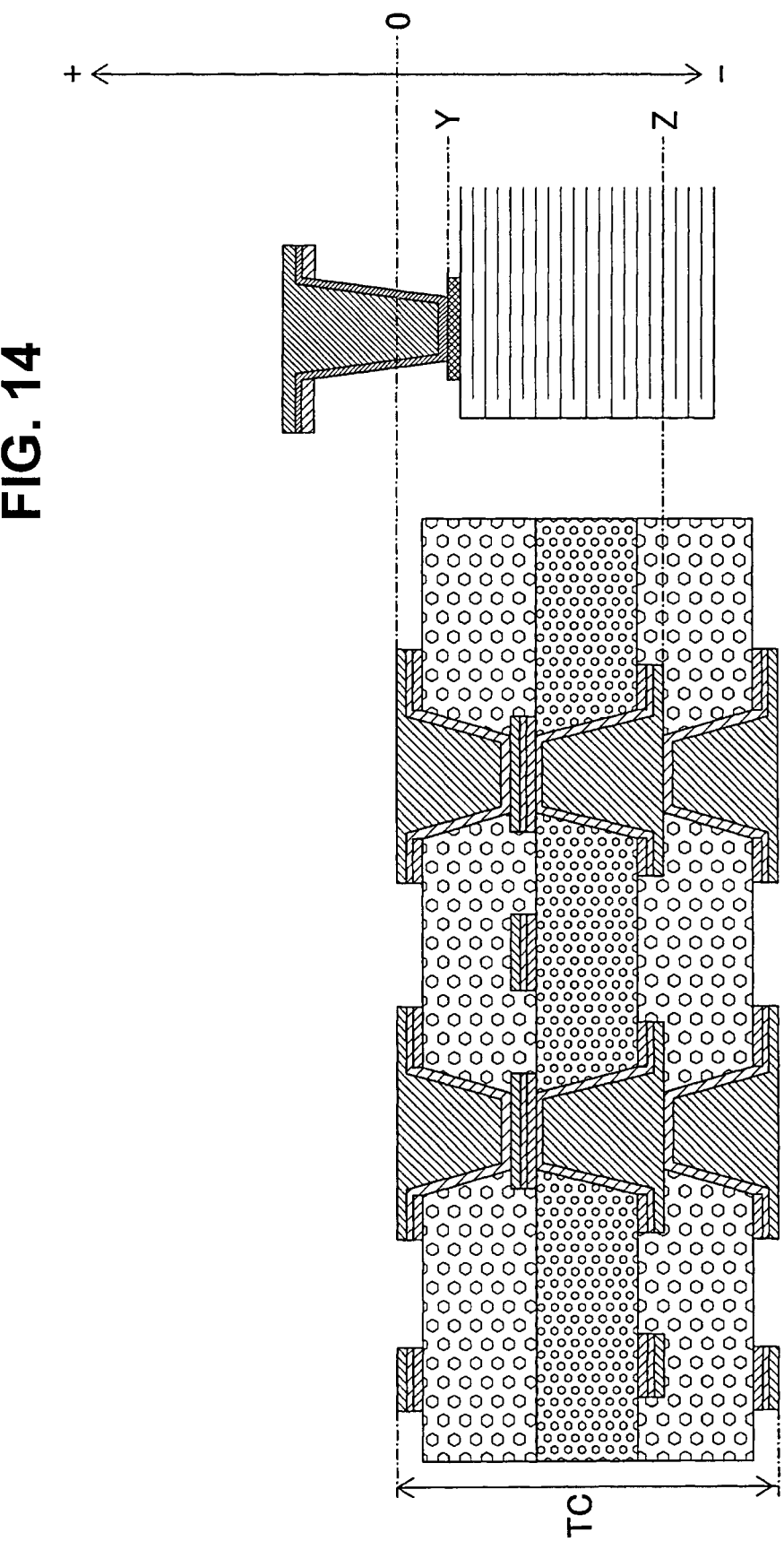
FIG. 14 is a magnified cross-sectional view of the core substrate and an electronic component.

FIG. 14 is a magnified cross-sectional view of a core substrate and an electronic component. The surface parallel to the upper surface of the first conductive layer is at zero, and the upper buildup layers are in the plus direction, and the lower buildup layers are in the minus direction. The connection interface between a connection via conductor and the electronic component is positioned at (Y). Then, the upper surface of the fourth conductive layer (upper surface of via conductor (20VIII)) is positioned at (Z). Since (Y) is positioned between zero and (Z), the interface between a connection via conductor and an electrode of the electronic component is positioned at a well balanced portion in the core substrate. Therefore, even if positions of via conductors of through-hole conductors and connection via conductors are unbalanced, connection reliability between the built-in electronic component and the printed wiring board is high according to the printed wiring board of a modified example of the second embodiment.

Manufacturing Method in the Second Embodiment and its Modified Example

Figure 4:
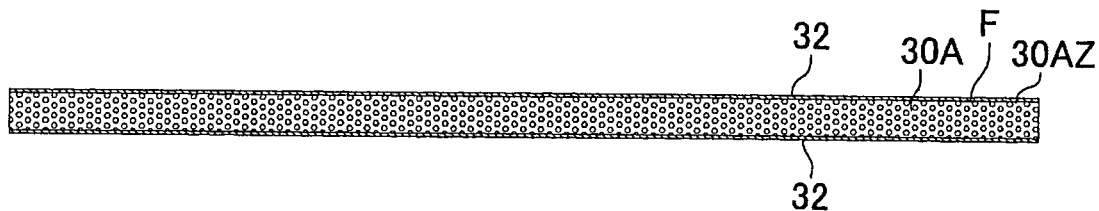
FIGS. 4(A)-4(E) are views showing steps of a method for manufacturing a printed wiring board according to the first embodiment.
Figure 4:
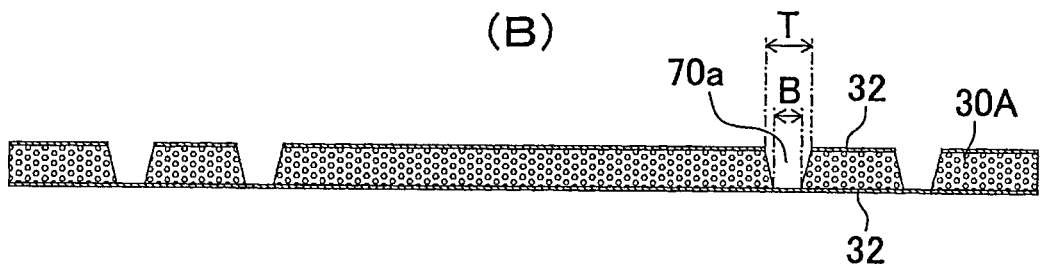
Figure 4:
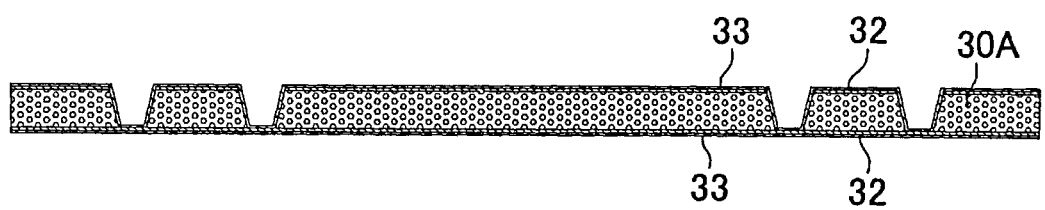
Figure 4:
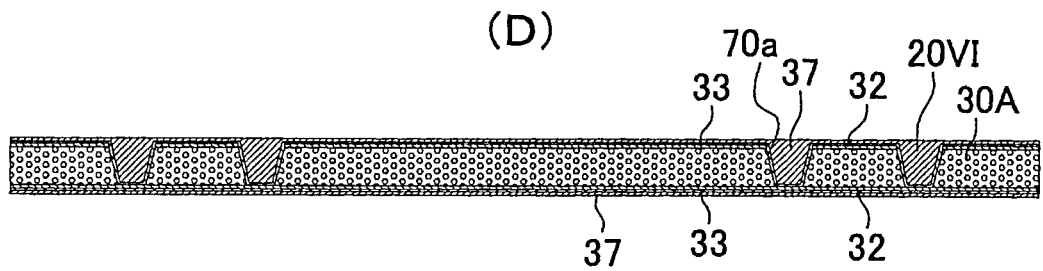
Figure 4:
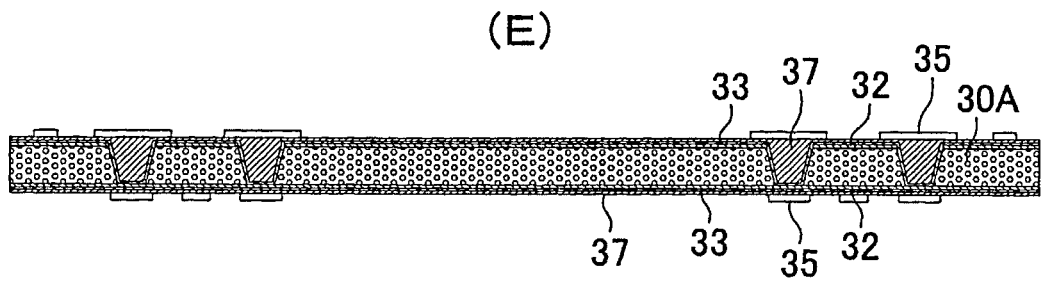
Figure 5:
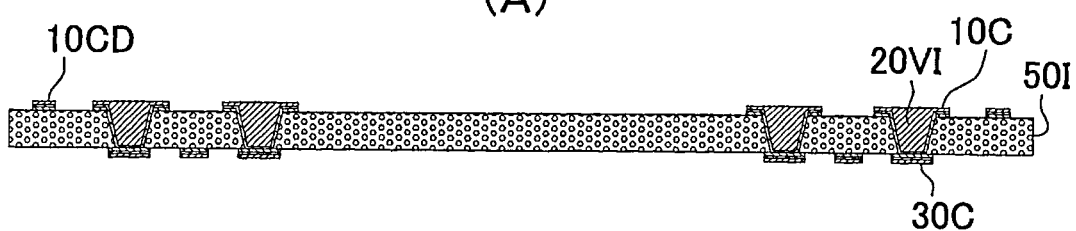
FIGS. 5(A)-5(D) are views showing steps of a method for manufacturing a printed wiring board according to the first embodiment.
Figure 5:
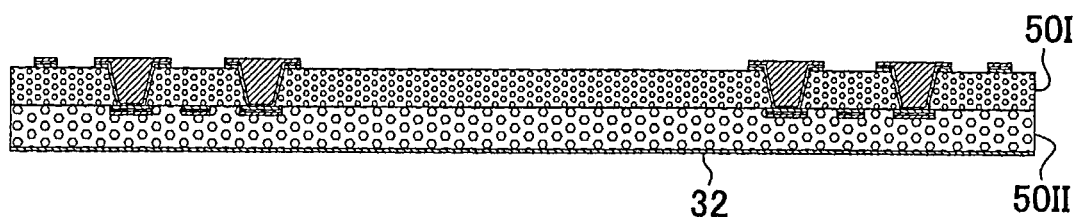
Figure 5:
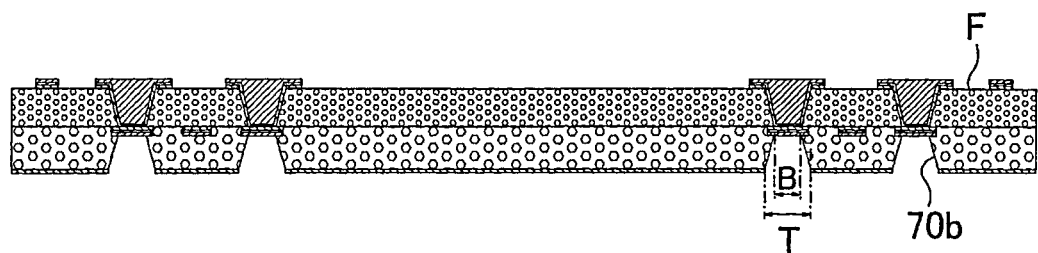
Figure 5:
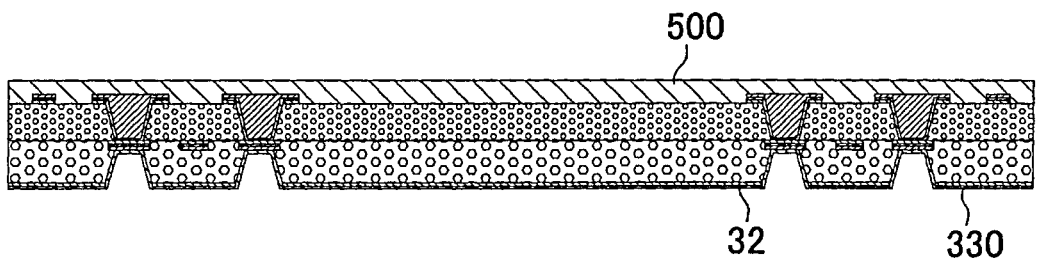
Figure 6:
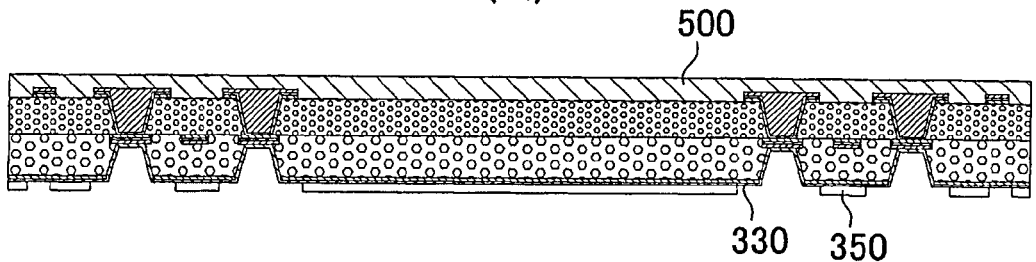
FIGS. 6(A)-6(D) are views showing steps of a method for manufacturing a printed wiring board according to the first embodiment.
Figure 6:
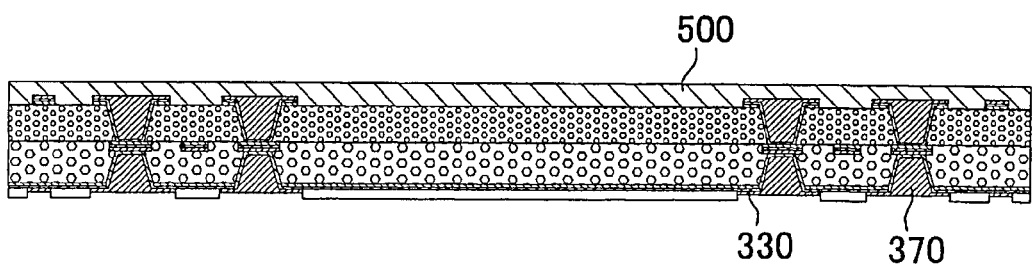
Figure 6:
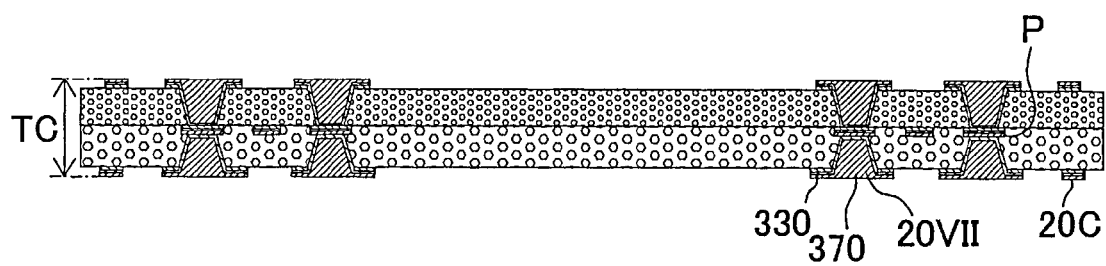
Figure 6:
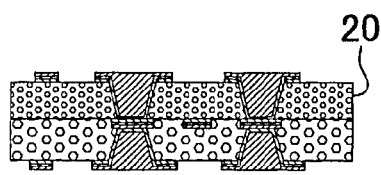
Figure 6:
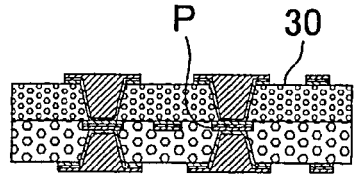
Figure 7:
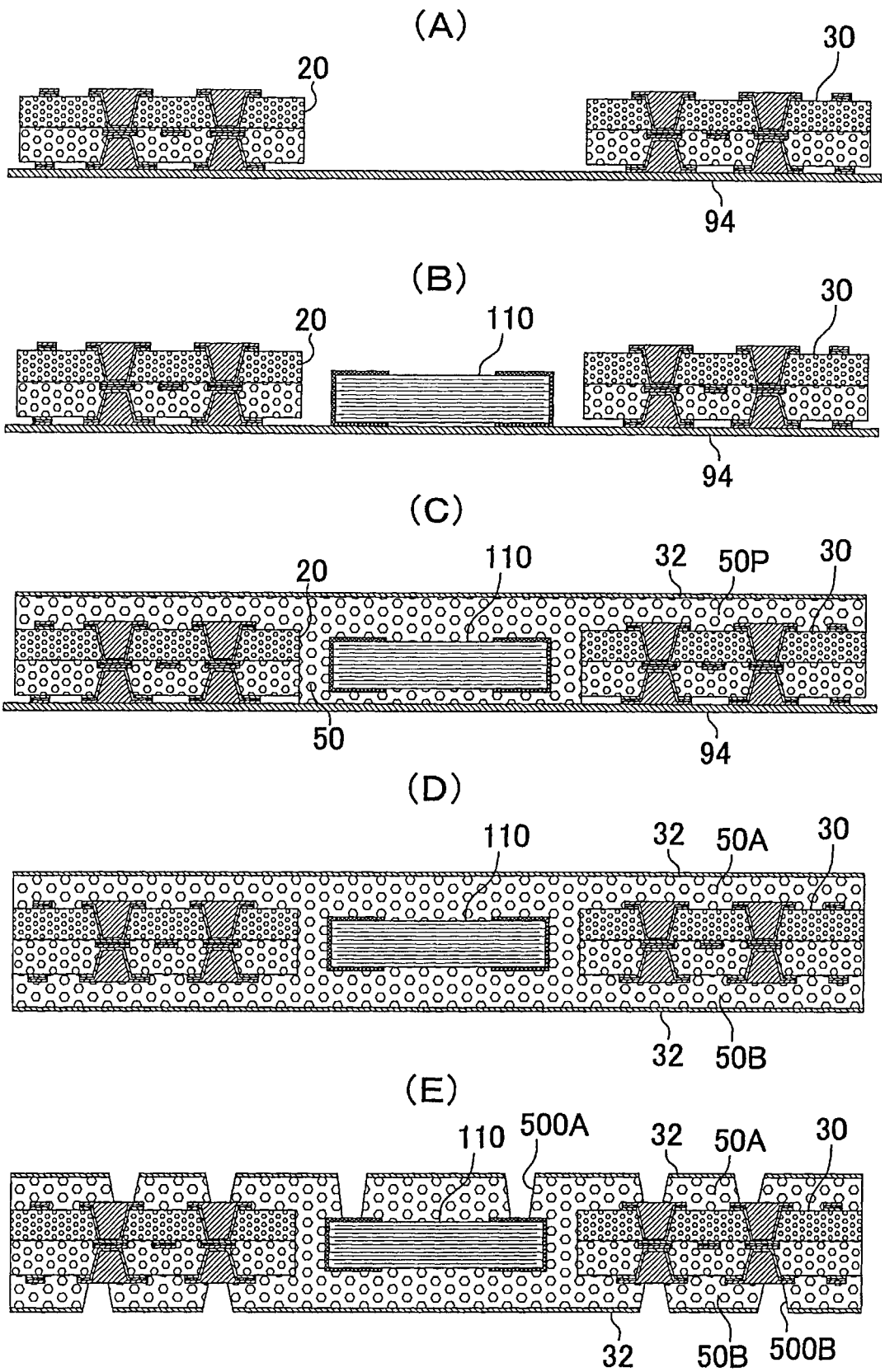
FIGS. 7(A)-7(E) are views showing steps of a method for manufacturing a printed wiring board according to the first embodiment.
Figure 8:
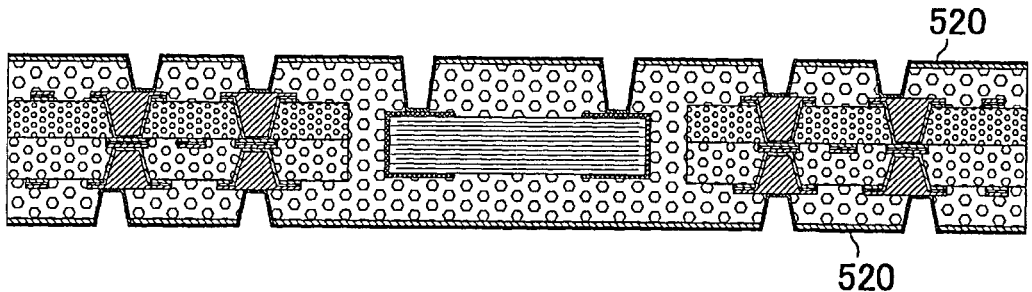
FIGS. 8(A)-8(D) are views showing steps of a method for manufacturing a printed wiring board according to the first embodiment.
Figure 8:
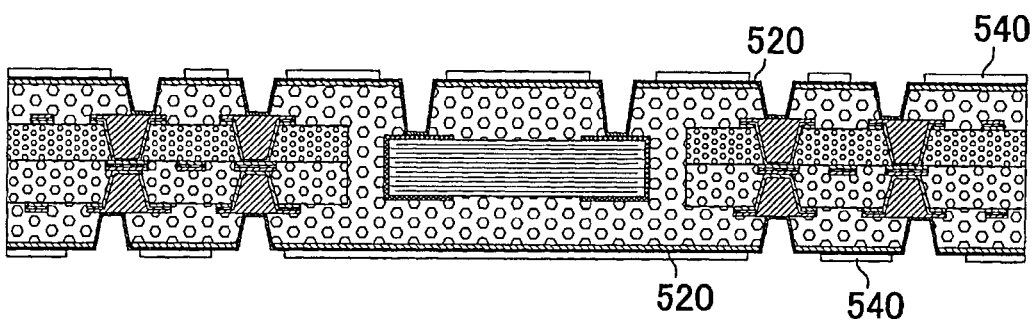
Figure 8:
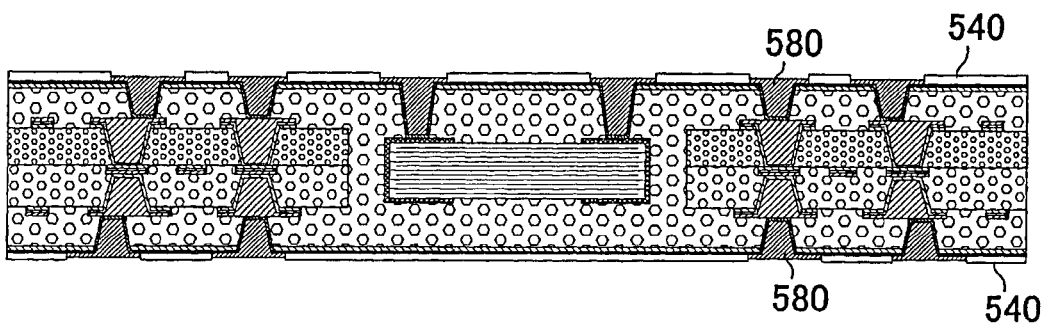
Figure 8:
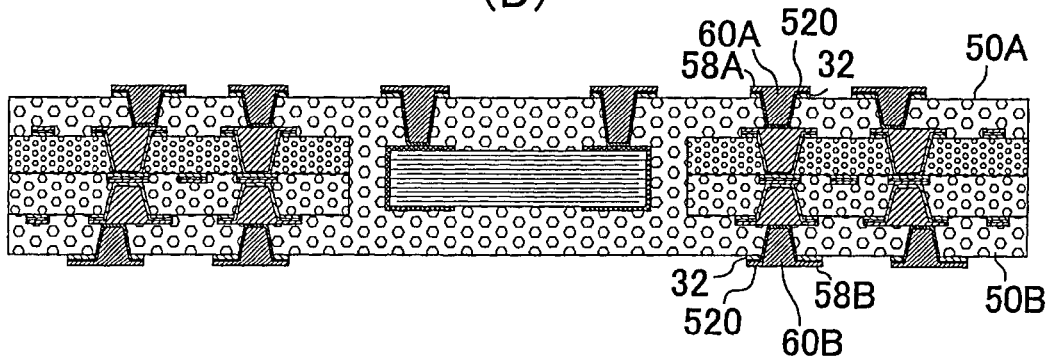
Figure 9:
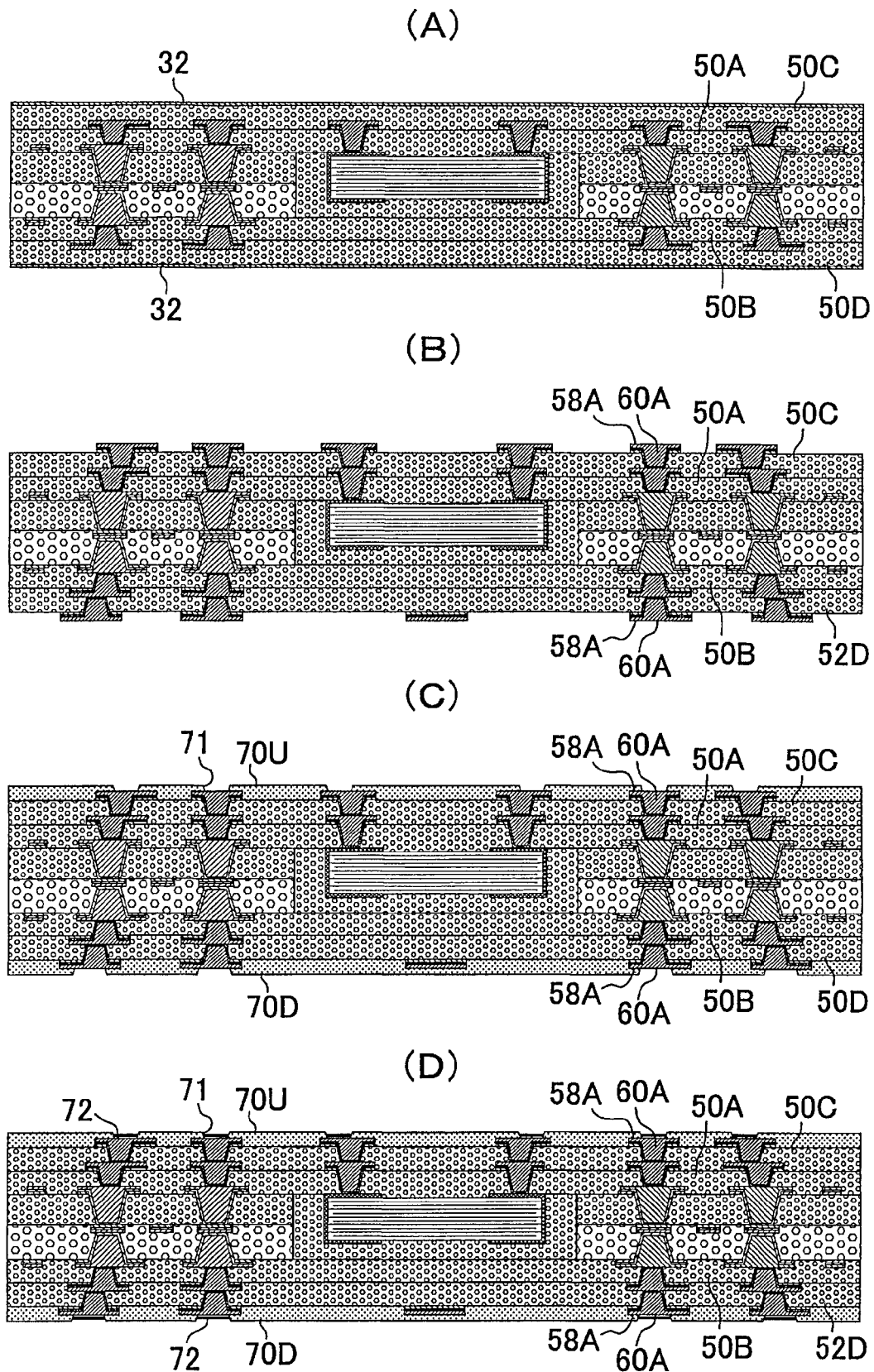
FIGS. 9(A)-9(D) are views showing steps of a method for manufacturing a printed wiring board according to the first embodiment.
Figure 15:
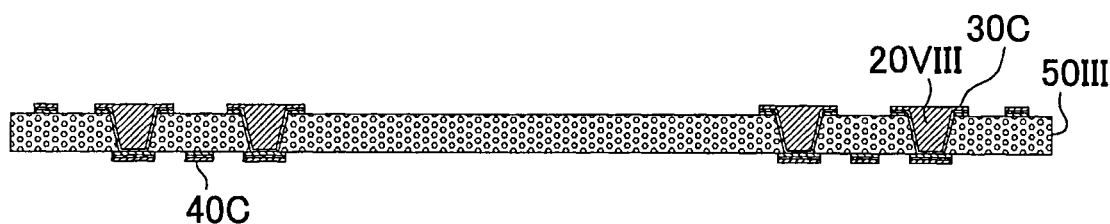
FIGS. 15(A)-15(D) are views showing steps of a method for manufacturing a printed wiring board according to the second embodiment.
Figure 15:
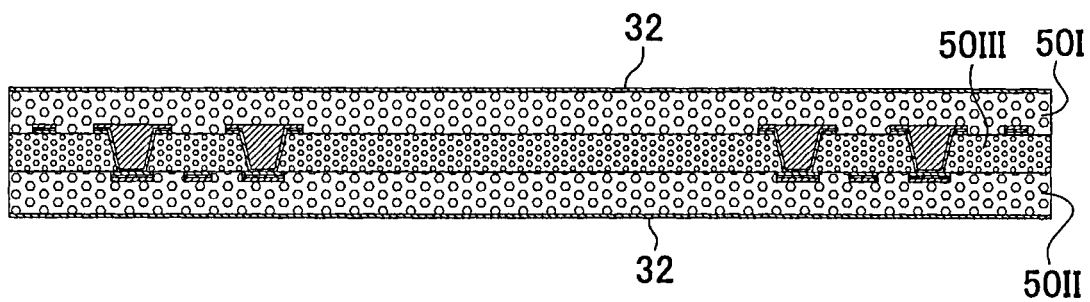
Figure 15:
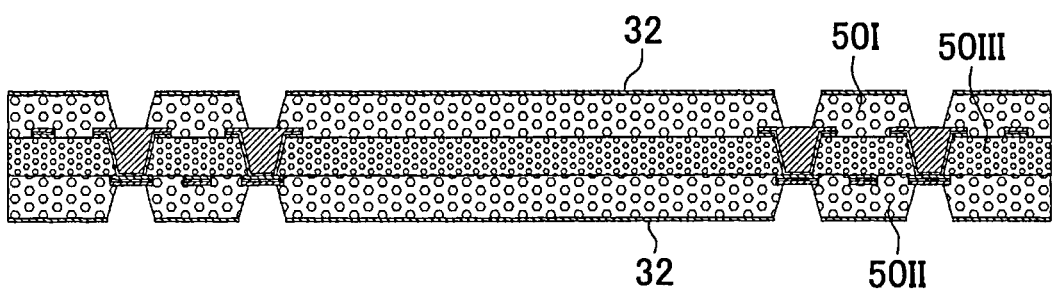
Figure 15:
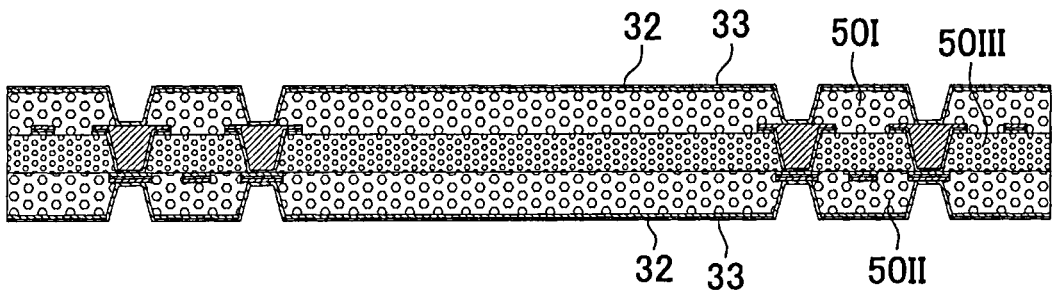

Using the method shown in FIGS. 4 through 5(A) in the first embodiment, a third resin layer, third conductive layer, fourth conductive layer and via conductors (20VIII) are formed (FIG. 15(A)). Next, prepreg and metal foils (32, 32) are laminated on both surfaces of the substrate shown in FIG. 15(A), and are thermally pressed to be integrated (FIG. 15(B)). A first resin layer and second resin layer sandwiching the third resin layer are formed. The same as in FIG. 5(C), via-conductor openings are formed in the first and second resin layers (FIG. 15(C)). Then, electroless plated films (33, 33) are formed on metal foils (32, 32) and on the inner walls of via-conductor openings (FIG. 15(D)).

Plating resist is formed on the electroless plated film, and electrolytic plated film is formed on the electroless plated film exposed from the plating resist. After that, the plating resist is removed, and the electroless plated film and metal foil exposed from the electrolytic plated film are removed. Then, opening 20 penetrating through the first, second and third resin layers is formed to complete core substrate 30 of the second embodiment (FIG. 11(A)). Opening 20 is a penetrating hole that reaches the second surface of the second resin layer from the first surface of the first resin layer.

By inversing the core substrate shown in FIG. 11(A), the core substrate of a modified example of the second embodiment is obtained.

Figure 12:
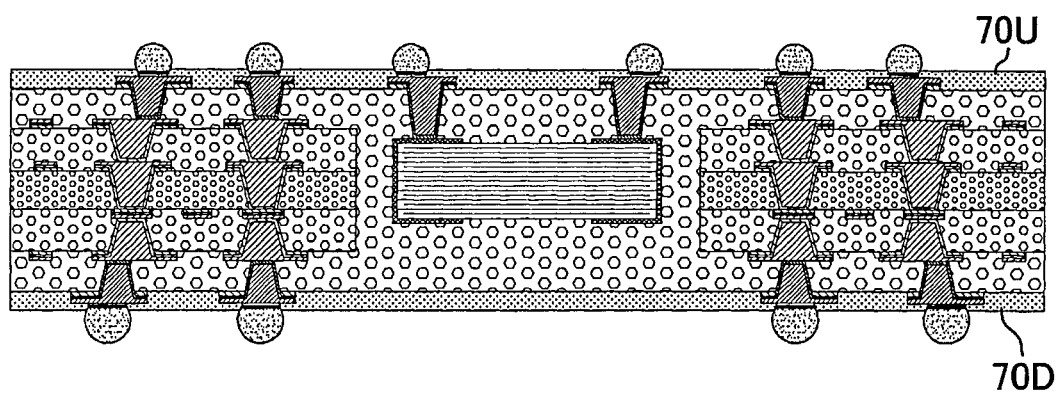
FIGS. 12(A)-12(B) are views of a printed wiring board according to the second embodiment and its applied example.
Figure 12:
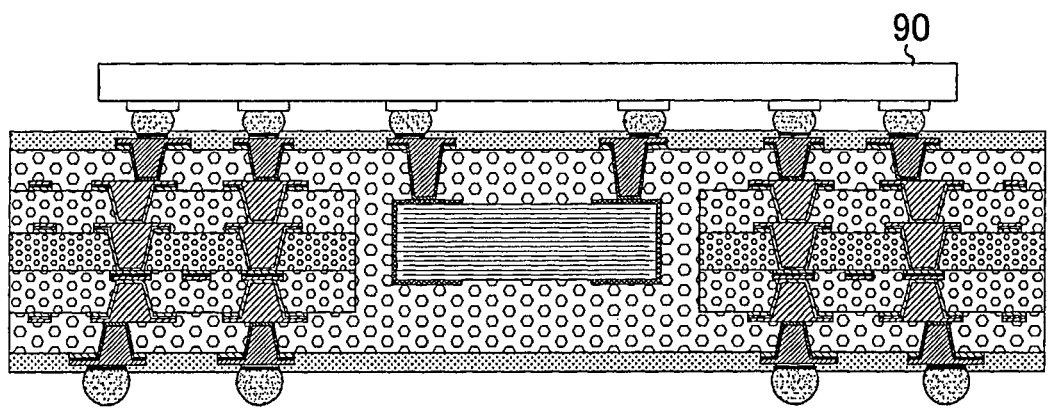
Figure 13:
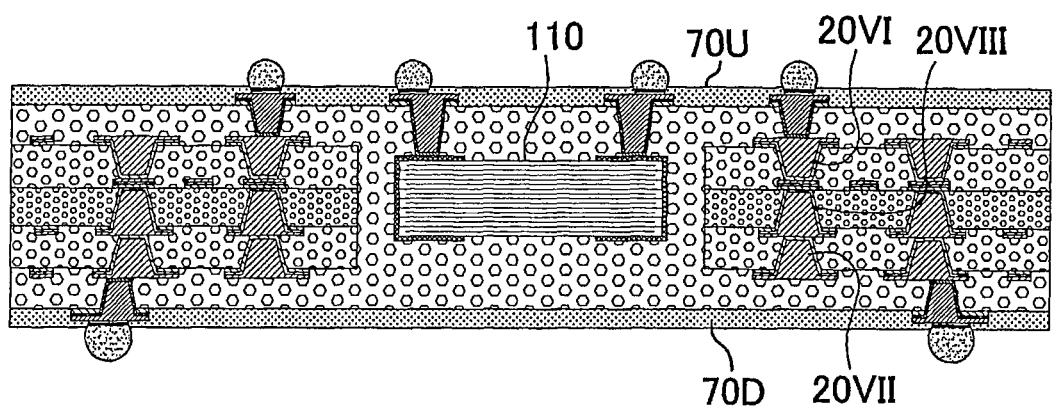
FIGS. 13(A)-13(B) are views showing printed wiring boards according to modified examples of the second embodiment.
Figure 13:
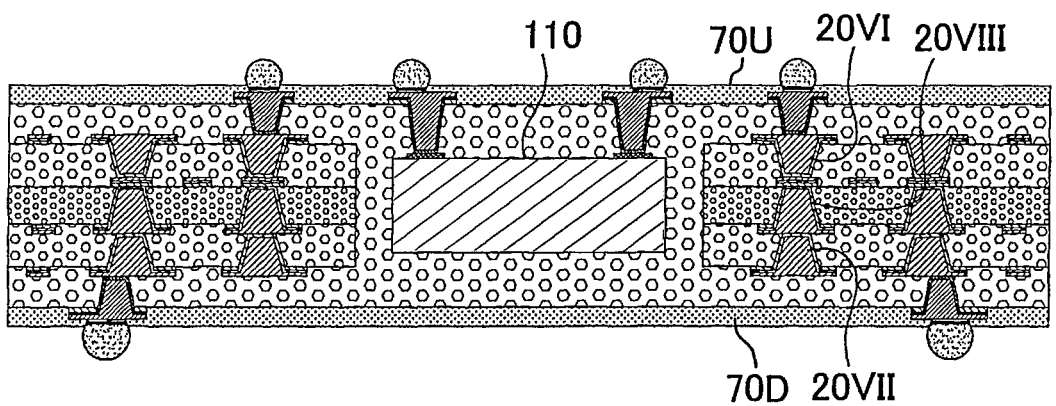

An electronic component is secured in the core substrate by a method the same as in the first embodiment. After that, upper and lower buildup layers and solder-resist layers are formed on the core substrate by the same method as in the first embodiment. The printed wiring board according to the second embodiment and its modified example are completed (FIGS. 12, 13).

Third Embodiment

Figure 16:
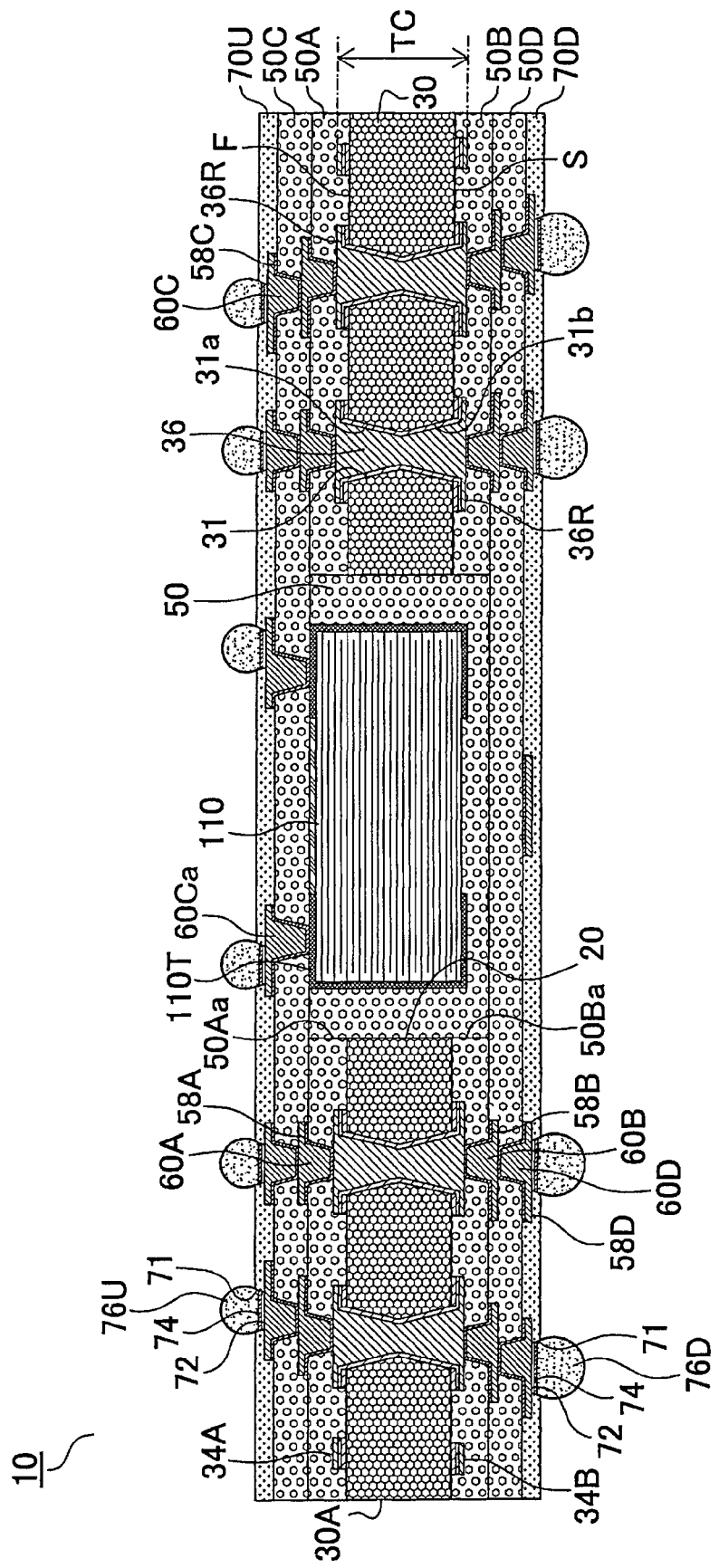
FIG. 16 is a printed wiring board according to a third embodiment.

FIG. 16 is a cross-sectional view of a printed wiring board according to a third embodiment. The core substrate of a printed wiring board of the third embodiment is formed with three resin layers, the same as that in the second embodiment. In the third embodiment, interlayer connection conductors formed in the third resin layer are shaped like an hourglass. In the third embodiment, a via conductor in the first resin layer, an interlayer connection conductor in the third resin layer and a via conductor in the second resin layer are laminated along a straight line. Those conductors form a through-hole conductor; the bottom surface of the via conductor in the first resin layer and the bottom surface of the via conductor in the second resin layer are connected to the interlayer connection conductor in the third resin layer. The third embodiment has the same effects as the first embodiment. Also, a through-hole conductor in the core substrate of the third embodiment is formed with three interlayer connection conductors, the same as in the second embodiment. As shown in FIG. 16, the through-hole conductor of the third embodiment has better symmetry than its counterpart of the second embodiment.

Manufacturing Method in the Third Embodiment

A substrate (third resin layer) having hourglass-shaped interlayer connection conductors may be manufactured using the method described in U.S. Pat. No. 7,786,390, the entire contents of which are incorporated herein by reference. Then, the same as in the second embodiment, resin layers (50I, 50II) and metal foils are formed on both surfaces of the third resin layer the same as shown in FIG. 15(B). After that, the core substrate of the third embodiment is manufactured by the same method as in the second embodiment. Upper and lower buildup layers and solder-resist layers are formed on the core substrate by the same method as in the first embodiment.

Example

A method for manufacturing an implementation example of printed wiring board 10 is shown in FIGS. 4-9.

(1) A starting material is double-sided copper-clad laminate (30AZ) made by insulative base (30A) having first surface (F) and a third surface opposite the first surface and copper foils 32 laminated on both of its surfaces. The thickness of the insulative base is 60 μm, and the thickness of copper foils is 3 μm. A black-oxide treatment not shown in the drawing is performed on surfaces of copper foils 32 (FIG. 4(A)). As an example of the starting material, 4785GS series made by Sumitomo Bakelite Co., Ltd. is listed.

(2) A laser is irradiated at double-sided copper-clad laminate (30AZ) from the first-surface (F) side of the insulative base. Via-conductor openings (70a) reaching copper foil 32 are formed (FIG. 4(B)). T is 80 μm, and (B) is 60 μm.

(3) Electroless copper-plated film 33 is formed on the inner walls of openings (70a) and on copper foils by performing electroless plating (FIG. 4(C)).

(4) Electrolytic copper-plated film 37 is formed on the electroless plated film by performing electrolytic plating. Openings (70a) are filled with electrolytic copper-plated film, and via conductors (20VI) are formed (FIG. 4(D)).

(5) Etching resist 35 with a predetermined pattern is formed on electrolytic copper-plated film 37 (FIG. 4(E)).

(6) Electrolytic copper-plated film 37, electroless copper-plated film 33 and copper foil 32 exposed from the etching resist are removed. Then, the etching resist is removed. First conductive layer (10C), third conductive layer (30C) and via conductors (20VI) are formed (FIG. 5(A)). The thicknesses of the first conductive layer and the third conductive layer are 15 μm each.

(7) Prepreg and metal foil are placed on the third surface of first resin layer (50I) and the third conductive layer. Then, prepreg and metal foil 32 on the third surface of first resin layer (50I) and the third conductive layer are laminated by thermal pressing. Second resin layer (50II) is formed from the prepreg (FIG. 5(B)). The thickness of the second resin layer is 60 μm.

(8) By irradiating a CO2 gas laser from the second-surface side of the second resin layer, via-conductor openings (70b) reaching the third conductive layer are formed in the second resin layer (FIG. 5(C)). T is 80 μm, and (B) is 60 μm.

(9) The first surface of the first resin layer and the first conductive layer are covered with protective film 500. Then, by performing electroless plating, electroless plated film 330 is formed on the inner walls of via-conductor openings (70b) and on metal foil 32 (FIG. 5(D)).

(10) Plating resist 350 is formed on electroless plated film 330 (FIG. 6(A)).

(11) Next, by performing electrolytic plating, electrolytic copper-plated film 370 is formed on electroless plated film 330 exposed from plating resist 350 (see FIG. 6(B)).

(12) Next, plating resist 350 is removed. Then, electroless plated film 330 and the metal foil exposed from the electrolytic copper-plated film are etched away to form second conductive layer (20C) made of metal foil 32, electroless plated film 330 and electrolytic plated film 370. Via conductors (20VII) are formed at the same time. Protective film 500 is removed (FIG. 6(C)). The thickness of the second conductive layer is 15 μm.

(13) Opening 20 is formed to reach the second surface of the second resin layer from the first surface of first resin layer (50I) (FIG. 6(D)). Core substrate 30 is completed. Thickness (TC) of the core substrate is 150 μm (FIG. 6(C)).

(14) PET film 94 is attached to the first surface of the core substrate (FIG. 7(A)).

(15) Chip capacitor 110 is placed on tape 94 exposed through opening 20 (FIG. 7(B)). The thickness of the chip capacitor is 120~140 μm. The size of the chip capacitor is 10 μm~30 μm smaller than the size of the opening.

(16) B-stage prepreg and metal foil 32 are laminated on the second surface of the core substrate and the electronic component. Resin seeps out from the prepreg into the opening by thermal pressing, and opening 20 is filled with filler (resin filler) 50 (FIG. 7(C)).

(17) After the tape is removed, B-stage prepreg and metal foil 32 are laminated on the first surface of the core substrate and the electronic component. The prepreg laminated on both surfaces of the core substrate is heated and cured to form interlayer resin insulation layers (50A, 50B) (FIG. 7(B)).

(18) Via-conductor openings (500A) reaching the first conductive layer and via conductors in the first resin layer are formed in interlayer resin insulation layer (50A). Simultaneously, via-conductor openings reaching the electrodes of the electronic component are formed.

Via-conductor openings (500B) reaching the second conductive layer and via conductors in the second resin layer are formed in interlayer resin insulation layer (50B). Electroless copper-plated film 520 is formed on metal foils (32, 32) and on the inner walls of openings (500A, 500B) (FIG. 8(A)). After that, plating resists (540, 540) are formed on the electroless plated films (FIG. 8(B)). Next, electrolytic copper-plated films (580, 580) are formed on the electroless plated films exposed from plating resists (540, 540) (FIG. 8(C)). Then, the plating resists are removed, and electroless copper-plated films (520, 520) and metal foils (32, 32) exposed from electrolytic plated films are removed. The first layers of the buildup layers are completed (FIG. 8(D)).

(19) Prepreg and metal foil are laminated on interlayer resin insulation layers (50A, 50B) and conductive layers (58A, 58B), and are thermally pressed to form interlayer resin insulation layers (50C, 50D) (FIG. 9(A)). Then, the steps in FIG. 7(E) through FIG. 8(D) are repeated to form the second layers of the buildup layers (FIG. 9(B)).

(20) Solder-resist layers (70U, 70D) having openings 71 are formed on the upper and lower buildup layers (FIG. 9(C)). Openings 71 expose portions of conductive layers and the upper surfaces of via conductors. Such portions work as pads.

(21) Metal film 72 made of a nickel layer and a gold layer on the nickel layer are formed on pads (FIG. 9(D)).

(22) After that, solder bumps (76U) are formed on the pads of the upper buildup layers, and solder bumps (76D) are formed on the pads of the lower buildup layers. Printed wiring board 10 having solder bumps is completed (FIG. 1).

The core substrate in each embodiment and a modified example has multiple resin layers. Then, interlayer connection conductors are formed in each resin layer. Also, since the depth of openings for interlayer connection conductors is shallow, defects such as voids are less likely to occur in the interlayer connection conductors. Accordingly, the strength of core substrates is enhanced.

Also, a through-hole conductor is formed with interlayer connection conductors formed in each resin layer. The opening diameter of each interlayer connection conductor is narrower than the diameter of the opening for a through-hole conductor that penetrates simultaneously through all the layers. Accordingly, through-hole conductors are formed at a narrower pitch in each embodiment and a modified example. As a result, since the printed wiring board is made smaller, warping of the printed wiring board is slight even if an opening for a built-in electronic component is formed in the core substrate. From the viewpoint described above, when an electronic component with a thickness of 0.05 mm to 0.15 mm is built into a core substrate of each embodiment and a modified example, the electronic component can maintain the initially designed quality.

When a core substrate is formed with three resin layers, and connection via conductors (via conductors in buildup layers that reach the electrodes of the electronic component in the core substrate) are formed only in the upper buildup layers, an electronic component with a size of 0.12 mm or smaller which is built into the core substrate can maintain the initially designed quality. Warping of a printed wiring board is improved by adjusting the positioning of via conductors in the printed wiring board, the size of the printed wiring board and the strength of the core substrate.

A printed wiring board according to an embodiment of the present invention has the following: a core substrate which is formed with a core material made of multiple resin layers having a first surface and a second surface opposite the first surface along with an opening that penetrates through the multiple resin layers to accommodate an electronic component, and which is formed with a first conductive layer formed on the first surface of the core material and a second conductive layer formed on the second surface of the core material; an electronic component accommodated in the opening of the core substrate; upper buildup layers which are formed on the first surface of the core substrate and on the first conductive layer, and which include a first interlayer resin insulation layer covering the opening; and lower buildup layers which are formed on the second surface of the core substrate and on the second conductive layer, and which include a second interlayer resin insulation layer covering the opening.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate;
an electronic component accommodated in the core substrate;
a first buildup structure formed on a first surface of the core substrate and comprising an interlayer resin insulation layer; and
a second buildup structure formed on a second surface of the core substrate and comprising an interlayer resin insulation layer,
wherein the core substrate includes a core material portion comprising a first resin layer, a second resin layer, a first interlayer connection conductor formed in the first resin layer, a second interlayer connection conductor formed in the second resin layer, a first conductive layer formed on a first surface of the core material portion and a second conductive layer formed on a second surface of the core material portion on an opposite side of the first surface of the core material portion, each of the first and second resin layers comprises a reinforcing material having a portion extending into a respective one of the first and second interlayer connection conductors, the core material portion has an opening portion penetrating through the resin layers and accommodating the electronic component in a space of the opening portion, the interlayer resin insulation layer of the first buildup structure is positioned such that the opening portion of the core material portion is covered on the first surface of the core material portion, the interlayer resin insulation layer of the second buildup structure is positioned such that the opening portion of the core material portion is covered on the second surface of the core material portion, and the first buildup structure has a plurality of pads positioned to mount an IC chip and a plurality of via conductors connecting the plurality of pads to electrodes of the electronic component and to the first conductive layer on the first surface of the core material portion.

2. The printed wiring board according to claim 1, wherein the core substrate has a third conductive layer interposed between the first resin layer and the second resin layer, the first interlayer connection conductor penetrating through the first resin layer such that the first interlayer connection conductor is connecting the third conductive layer and the first conductive layer, and the second interlayer connection conductor penetrating through the second resin layer such that the second interlayer connection conductor is connecting the third conductive layer and the second conductive layer.

3. The printed wiring board according to claim 1, wherein the plurality of resin layers of the core material portion has a third resin layer interposed between the first resin layer and the second resin layer, and the core substrate includes a third conductive layer interposed between the first resin layer and the third resin layer, a fourth conductive layer interposed between the second resin layer and the third resin layer, the first interlayer connection conductor penetrating through the first resin layer such that the first interlayer connection conductor is connecting the first conductive layer and the third conductive layer, the second interlayer connection conductor penetrating through the second resin layer such that the second interlayer connection conductor is connecting the fourth conductive layer and the second conductive layer, and a third interlayer connection conductor penetrating through the third resin layer and connecting the third conductive layer and the fourth conductive layer.

4. The printed wiring board according to claim 1, wherein the core material portion comprises a plurality of resin layers including the first and second resin layers such that each of the resin layers of the core material portion includes a reinforcing material.

5. The printed wiring board according to claim 1, wherein the interlayer resin insulation layer in the first buildup structure includes a reinforcing material, and the interlayer resin insulation layer in the first buildup structure includes a reinforcing material.

6. The printed wiring board according to claim 1, wherein the interlayer resin insulation layer in the first buildup structure does not contain a reinforcing material, and the interlayer resin insulation layer in the second buildup structure does not contain a reinforcing material.

7. The printed wiring board according to claim 1, wherein the second buildup structure has a plurality of pads positioned to connect a motherboard.

8. The printed wiring board according to claim 1, wherein the second buildup structure has a plurality of motherboard pads positioned to connect a motherboard and a plurality of via conductors connecting the plurality of motherboard pads to the second conductive layer on the second surface of the core material portion.

9. The printed wiring board according to claim 2, wherein the first interlayer connection conductor has a bottom surface connected to the third conductive layer and having a diameter which is set smaller than a diameter of the first interlayer connection conductor at an interface between the first resin layer and the first conductive layer, and the second interlayer connection conductor has a bottom surface connected to the third conductive layer and having a diameter which is set smaller than a diameter of the second interlayer connection conductor at an interface between the second resin layer and the second conductive layer.

10. The printed wiring board according to claim 2, wherein the first interlayer connection conductor is formed on the second interlayer connection conductor.

11. The printed wiring board according to claim 3, wherein the third interlayer connection conductor has a bottom surface connected to the fourth conductive layer and having a diameter which is set smaller than a diameter of the third interlayer connection conductor at an interface between the third resin layer and the third conductive layer, the second interlayer connection conductor has a bottom surface connected to the fourth conductive layer and having a diameter which is set smaller than a diameter of the second interlayer connection conductor at an interface between the second resin layer and the second conductive layer, and the first interlayer connection conductor has a bottom surface connected to the third conductive layer and having a diameter which is set smaller than a diameter of the first interlayer connection conductor at an interface between the first resin layer and the first conductive layer.

12. The printed wiring board according to claim 3, wherein the third interlayer connection conductor has a bottom surface connected to the third conductive layer and having a diameter which is set smaller than a diameter of the third interlayer connection conductor at an interface between the third resin layer and the fourth conductive layer, the first interlayer connection conductor has a bottom surface connected to the third conductive layer and having a diameter which is set smaller than a diameter of the first interlayer connection conductor at an interface between the first resin layer and the first conductive layer, and the second interlayer connection conductor has a bottom surface connected to the fourth conductive layer and having a diameter which is set smaller than a diameter of the second interlayer connection conductor at an interface between the second resin layer and the second conductive layer.

13. The printed wiring board according to claim 3, wherein the third interlayer connection conductor has an hourglass shape.

14. The printed wiring board according to claim 3, wherein each of the first, second and third resin layers has a thickness which is set less than a thickness of the electronic component, and the thickness of the third resin layer is greater than the thickness of the first resin layer and the thickness of the second resin layer.

15. The printed wiring board according to claim 3, wherein the first interlayer connection conductor is formed on the third interlayer connection conductor, and the second interlayer connection conductor is formed on the third interlayer connection conductor.

16. The printed wiring board according to claim 9, wherein the first interlayer connection conductor becomes narrower in diameter toward the bottom surface of the first interlayer connection conductor, and the second interlayer connection conductor becomes narrower in diameter toward the bottom surface of the second interlayer connection conductor.

17. The printed wiring board according to claim 11, wherein the second buildup structure has a plurality of pads positioned to connect a motherboard.

18. The printed wiring board according to claim 11, wherein the first interlayer connection conductor becomes narrower in diameter toward the bottom surface of the first interlayer connection conductor, the second interlayer connection conductor becomes narrower in diameter toward the bottom surface of the second interlayer connection conductor, and the third interlayer connection conductor becomes narrower in diameter toward the bottom surface of the third interlayer connection conductor.

19. The printed wiring board according to claim 12, wherein the second buildup structure has a plurality of pads positioned to connect a motherboard.

20. The printed wiring board according to claim 12, wherein the first interlayer connection conductor becomes narrower in diameter toward the bottom surface of the first interlayer connection conductor, the second interlayer connection conductor becomes narrower in diameter toward the bottom surface of the second interlayer connection conductor, and the third interlayer connection conductor becomes narrower in diameter toward the bottom surface of the third interlayer connection conductor.

* * * * *